(12) United States Patent
Schweid

(10) Patent No.: US 10,734,441 B1
(45) Date of Patent: Aug. 4, 2020

(54) SELECTIVELY ADJUSTABLE LIGHTING SYSTEM

(71) Applicant: Intellytech LLC, Centennial, CO (US)

(72) Inventor: Aaron Schweid, Aurora, CO (US)

( * ) Notice: Subject to any disclaimer, the term of this patent is extended or adjusted under 35 U.S.C. 154(b) by 0 days.

(21) Appl. No.: 16/354,837

(22) Filed: Mar. 15, 2019

Related U.S. Application Data

(60) Provisional application No. 62/643,297, filed on Mar. 15, 2018.

(51) Int. Cl.
F21V 29/503 (2015.01)
F21V 29/83 (2015.01)
F21V 29/77 (2015.01)
H05B 45/20 (2020.01)
F21Y 113/13 (2016.01)
F21Y 105/18 (2016.01)
F21Y 115/10 (2016.01)
H01L 27/15 (2006.01)
H05B 33/12 (2006.01)
H05B 45/10 (2020.01)

(52) U.S. Cl.
CPC ........... H01L 27/156 (2013.01); H05B 33/12 (2013.01); H05B 45/10 (2020.01)

(58) Field of Classification Search
None
See application file for complete search history.

(56) References Cited

U.S. PATENT DOCUMENTS

| 7,429,117 | B2* | 9/2008 | Pohlert | H05B 45/20 362/11 |
| D607,915 | S* | 1/2010 | Fong | D16/237 |
| 8,657,460 | B2* | 2/2014 | Bhardwaj | F21S 9/03 362/183 |
| 9,013,367 | B2* | 4/2015 | Cope | G09F 9/30 345/1.3 |
| 10,216,066 | B2* | 2/2019 | Pilby | F21V 11/065 |
| 2002/0044435 | A1* | 4/2002 | Pohlert | G03B 15/05 362/13 |
| 2008/0062691 | A1* | 3/2008 | Villard | F21V 14/02 362/249.16 |

(Continued)

FOREIGN PATENT DOCUMENTS

CN 207674154 U * 7/2018

OTHER PUBLICATIONS

"Intellytech LiteCloth LC-160 hands on review" retrieved from https://www.newsshooter.com/2018/01/29/intellytech-litecloth-lc-160-hands-review/, published Jan. 29, 2018 (Year: 2018).*

Primary Examiner — Britt D Hanley
(74) Attorney, Agent, or Firm — FisherBroyles, LLP; Craig W. Mueller

(57) ABSTRACT

A selectively-configurable lighting system is provided that employs at least two light emitting diode arrays configured on a rigid or semi-rigid panel. The adjacent lighting arrays are interconnected by a soft or flexible material that allows for the light emitting diode arrays to be folded upon each other to decrease the perimeter of the lighting system when it is not in use. The lighting emitting diode arrays include a plurality of light emitting diodes that may produce single color, bi-color, or tri-color light. The light emitting diode arrays are selectively controlled with a controller that allows for a user to selectively control or the output of the lights to yield a lighting effect of a predetermined nature or character.

20 Claims, 24 Drawing Sheets

(56) References Cited

U.S. PATENT DOCUMENTS

| | | | |
|---|---|---|---|
| 2011/0216521 A1* | 9/2011 | Howe | G02B 5/0284 |
| | | | 362/34 |
| 2013/0176481 A1* | 7/2013 | Holmes | H04N 5/2354 |
| | | | 348/370 |
| 2014/0270742 A1* | 9/2014 | Karle | F21V 1/143 |
| | | | 396/4 |
| 2015/0226414 A1* | 8/2015 | Manahan | F21V 23/06 |
| | | | 362/249.02 |
| 2016/0033717 A1* | 2/2016 | Hofman | E04B 2/7455 |
| | | | 362/606 |
| 2016/0281974 A1* | 9/2016 | Song | F21V 25/12 |
| 2017/0146203 A1* | 5/2017 | Belaidi | H05B 45/60 |
| 2017/0254518 A1* | 9/2017 | Vasylyev | G02B 6/0083 |
| 2018/0038578 A1* | 2/2018 | Son | H05K 3/06 |
| 2018/0202618 A1* | 7/2018 | Jenks | G01N 21/8803 |
| 2019/0032868 A1* | 1/2019 | Jiang | F21V 19/0035 |
| 2019/0086059 A1* | 3/2019 | Hirakata | F21V 15/012 |

\* cited by examiner

SELECTIVELY ADJUSTABLE LIGHTING SYSTEM

This application claims the benefit of U.S. Provisional Patent Application Ser. No. 62/643,297, filed Mar. 15, 2018, the entirety of which is incorporated by reference herein.

This application is also related to U.S. patent application Ser. No. 29/639,295, filed Mar. 5, 2018, and U.S. patent application Ser. No. 29/643,202, filed Apr. 5, 2018, the entireties of which are incorporated by reference herein.

FIELD OF THE INVENTION

Embodiments of the present invention relate generally to lighting systems commonly used for photography and film production. One embodiment of the present invention employs a plurality of light-emitting diode (LED) arrays integrated onto a foldable mat.

BACKGROUND OF THE INVENTION

Single color, bi-color, and tri-color lights are used to illuminate subjects being photographed or filmed. Lights are selectively mounted a predetermined distance from the subject to suit the lighting professional or artist's desires. It is also often desirable to selectively alter the character of light exposing the subject.

One drawback of existing lighting systems is that they are often large, bulky, difficult to install, and difficult to transport. Those of ordinary skill in the art will appreciate that the nature of the subject may dictate the required lighting needs and effects, so this drawback may not be an issue in some situations. In other situations, however, these drawbacks are very detrimental, especially when a sole professional is tasked with transporting the tools of their trade to an off-site location.

Accordingly, it is a long felt need in the image capturing field to provide an easy to store and transport lighting system that allows for selective subject lighting. The following disclosure describes an improved lighting system that fulfills the lighting needs most professionals required but is able to deploy and store quickly and easily.

SUMMARY OF THE INVENTION

It is one aspect of some embodiments of the present invention to provide a lighting system comprised of at least two light emitting diode (LED) arrays separated by a foldable border. Accordingly, portions of the lighting system are flexible and allow the system to fold upon itself for storage. The LED arrays may also be adapted to fold relative to each other in such a way so that rear surfaces of adjacent LED arrays are mated in the folded configuration. This functionality also allows for the light emitted from the LED arrays to be selectively directed to provide light in various ways. That is, the LED arrays can be positioned within the same plane or angled relative to each other during use.

The LED arrays are comprised of a substrate with a plurality of LEDs. Individual LEDs, or clusters thereof, are configured to emit single colored, bi-colored, or tri-colored light depending on user needs. In one embodiment, the light emitting diode array is square with a 22"×22" area. The LEDs are positioned in grid fashion—16 rows and 16 columns. One of ordinary skill in the art will appreciate that the number and arrangement of LEDs can be modified and the invention is not dependent on the number or form of LEDs. Again, the LEDs provided on the substrate are configured to allow the user to create broad, bright, and natural looking light. For example, the LEDs employed by one embodiment of the present invention are adapted to reach 160 W to produce an output equivalent to that of a 1500 W tungsten soft light. The lighting system may also employ a softbox, i.e., a member extending from the LED arrays, which helps direct light at a predetermined area. In other embodiments, the lighting system is designed to create a spread of light that wraps around the subject.

It is another aspect of some embodiments of the present invention to provide a lighting system that is easy to transport. More specifically, the lighting system as contemplated herein is comprised of LED arrays interconnected to rigid or semi-rigid backing portions interconnected by foldable borders. The border and associated outer surface material are made of a compliant material that provides at least one folding line, which allows the LED arrays to fold relative to each other. As will be appreciated upon review of the figures and associated description provided below, the compliant nature of the borders allows for the lighting systems of some embodiments of the present invention to fold into a 12"×12" square, wherein the thickness of the full the configuration is a function of the number of LED arrays provided. Accordingly, users can travel with the 2'×2' lighting system that takes up less space than a conventional 1'×1' light panel. This functionality allows the lighting system to be deployed quickly without the need for large and cumbersome support frames utilized by prior art systems.

As alluded to above, is another aspect of some embodiments of the present invention to provide a system that can be quickly and intuitively mounted. A mounting bracket configured to selectively interconnect to a stand can be provided that receives the lighting system. In one embodiment, hook and loop interconnection means, i.e., Velcro® connection systems, are used to secure the lighting system to the frame. Those of ordinary skill in the art will appreciate, however, other interconnection mechanisms may be used to interconnect the lighting system to a mounting bracket such as snaps, magnets, fasteners, etc. without departing from the scope of the invention. The mounting bracket may be collapsible allowing it to be transported easily along with the folded lighting system. It is, thus, contemplated that a kit may be provided including the lighting system, the foldable bracket, a softbox, a diffusing grid, a mounting bracket, a controller, a battery, power cables, an AC power source, etc. that fit neatly into a carrying case. The carrying case that accepts one embodiment of the present invention is about 19"×16"×4.5". Another case is about 20.75"×13.5"×5.5".

It is yet another aspect of some embodiments of the present invention to provide a lighting system that provides light at the following Color Rendering Index (CRI) and Television Lighting Consistency Index (TLCI) Ratings:

| Color Temperature | CRI | TLCI |
| --- | --- | --- |
| 3,000 k | 97 | 98 |
| 5,600 k | 95 | 96 |
| 10,000 k | 94 | 93 |

In addition, the lighting systems of one embodiment produce broad, natural light as if shooting through a silk or softbox. Further, the output measured directly in the center of the lighting system or LED array can be as bright as the output measured on its edge. For example, the light system can produce outputs as follows:

| Distance | Mixed Color Temp. | 3,000k | 10,000k |
|---|---|---|---|
| 3 Feet | 5,725 Lux/532 FC | 4,500 Lux/418 FC | 5,250 Lux/488 FC |
| 6 Feet | 1,510 Lux/140 FC | 1,230 Lux/114 | 1,470 Lux/137 FC |
| 9 Feet | 772 Lux/72 FC | 656 Lux/61 FC | 722 Lux/67 FC |

To achieve these effects, a diffuser may be employed over the LED arrays. A plurality of diffusing strips, which cross vertically and horizontally to create a matrix, may also be employed to provide the user with more options regarding light focusing and diffusion.

As one of ordinary skill in the art will appreciate, the color temperatures described above may be created by selectively "tuning" light emitted from the individual light emitting diodes of the LED array. Accordingly, a controller communicates with each LED and/or each LED array is configured to selectively alter the output of each LED, or a subset thereof, to yield an aggregate color temperature or effect. For example, the lighting system may be configured to provide light from 3000K-10,000K with excellent color rendition (CRI/TLCI 95+). In addition to enhancing creative control, the contemplated color range also gives the user about one-hundred percent output from 3500K-9500K. In some embodiments, all the LEDs of the LED array are illuminated throughout the range, which makes output loss not a concern. The controller allows users to select a color or brightness level (0-100%) via an interconnected or remote touch-screen or knobs. Those of ordinary skill in the art will appreciate the controller may wirelessly communicate with the lighting system. Brightness and output of the lighting system of one embodiment can be controlled via 512 DMX controller powered via AC power source or battery that also powers the LEDs.

The lighting system of some embodiments of the present invention may include four LED arrays in a 2×2 pattern that generally fold into a shape having roughly ½ the perimeter of the extended configuration. Other embodiments of the present invention employ three LED arrays in a 1×3 pattern that fold relative to each other to also provide a folded configuration roughly ½ of the extended configuration.

Is still yet another aspect of the same embodiment to provide a large panel that receives multiple lighting systems. A bracket or support structure may be employed that interconnects the large panel to a stand which allows the interconnected light systems to be rotated or tilted as the user desires. The large panel may also be selectively foldable for storage and/or to give the user further light-directing options.

Images and videos of embodiments of the present invention can be found at https://www.intellytechusa.com/; https://www.intellytechusa.com/collections/litecloth-lc-160-models; https://www.intellytechusa.com/collections/litecloth-lc-120-models/products/litecloth-lc-120-1x3-foldable-led-mat-kit; and https://www.intellytechusa.com/collections/litecloth-lc-120-models/products/f2-lc-litecloth-2-light-frame-for-lc-160-lc-120, which are incorporated by reference in their entirety herein.

The Summary of the Invention is neither intended nor should it be construed as being representative of the full extent and scope of the present invention. That is, these and other aspects and advantages will be apparent from the disclosure of the invention(s) described herein. Further, the above-described embodiments, aspects, objectives, and configurations are neither complete nor exhaustive. As will be appreciated, other embodiments of the invention are possible using, alone or in combination, one or more of the features set forth above or described below. Moreover, references made herein to "the present invention" or aspects thereof should be understood to mean certain embodiments of the present invention and should not necessarily be construed as limiting all embodiments to a particular description. The present invention is set forth in various levels of detail in the Summary of the Invention as well as in the attached drawings and the Detailed Description of the Invention and no limitation as to the scope of the present invention is intended by either the inclusion or non-inclusion of elements, components, etc. in this Summary of the Invention. Additional aspects of the present invention will become more readily apparent from the Detail Description, particularly when taken together with the drawings.

BRIEF DESCRIPTION OF THE DRAWINGS

The accompanying drawings, which are incorporated in and constitute a part of the specification, illustrate embodiments of the invention and together with the general description of the invention given above and the detailed description of the drawings given below serve to explain the principles of these inventions.

Figure 1:
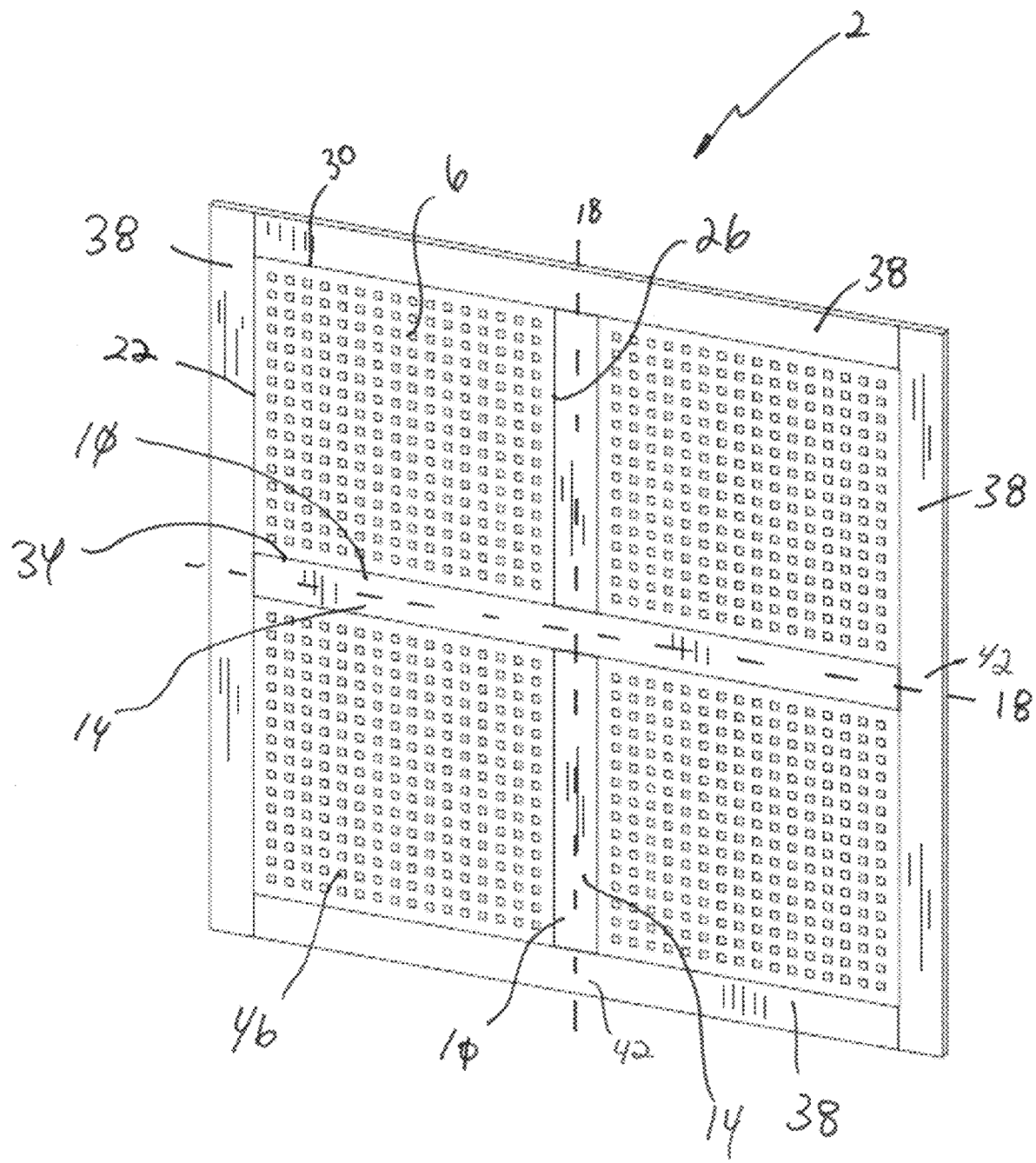
FIG. 1 is a front perspective view of a lighting system of one embodiment of the present invention.

The following component list and associated numbering found in the drawings is provided to assist in the understanding of one embodiment of the present invention:

| # | Component |
|---|---|
| 2 | Lighting system |
| 6 | LED Array |
| 10 | Border |
| 14 | Folding portion |
| 18 | Transverse axis |
| 22 | Left edge |
| 26 | Right edge |
| 30 | Top edge |
| 34 | Bottom edge |
| 38 | Outer border |
| 42 | Folding portion |
| 46 | Light Emitting Diode (LED) |
| 60 | Bracket |
| 64 | Stand |
| 68 | Controller |
| 72 | Lightbox |
| 76 | Diffusing sheet |
| 80 | Diffusing strip |
| 84 | Central portion |
| 88 | Mount |
| 92 | Hinge |
| 96 | Secondary portion |
| 100 | Arm |
| 104 | Knob |
| 200 | Frame |
| 204 | Stand |
| 208 | Mounting panel |
| 212 | Mounting locations |

It should be understood that the drawings are not necessarily to scale. In certain instances, details that are not necessary for an understanding of the invention or that render other details difficult to perceive may have been omitted. It should be understood, of course, that the invention is not necessarily limited to the particular embodiments illustrated herein.

DETAILED DESCRIPTION

FIGS. 1-5 show a lighting system 2 of one embodiment of the present invention comprised of four LED arrays 6 positioned in a 2×2 fashion. Between each LED array 6 is a border 10 with a folding portion 14 that allows the lighting system 2 to be bent along transverse axes 18. In this example, the borders 10 are positioned between a left 22 and a right edge 26 of adjacent LED arrays and between a top edge 30 and a bottom edge 34 of adjacent LED arrays. An outer border 38 may also be employed to add rigidity to the lighting system 2. As one of ordinary skill in the art will appreciate, folding portions 42 of the outer border 38 will allow the lighting system 2 to be bent and folded along each transverse axis 18 independently or together to form the folded configuration shown in FIG. 5.

The LED arrays 6 of this embodiment of the present invention are generally square or rectangle and employ a plurality of LEDs 46. The LEDs may be interconnected to a flexible substrate that is interconnected to a more rigid backing material. Indeed, in this embodiment, four rigid panels are interconnected by way of the aforementioned foldable borders 10. The LEDs are interconnected to a single controller, but in other embodiments, the LED arrays 6 are interconnected to separate controllers to allow for more customization.

Figure 2:
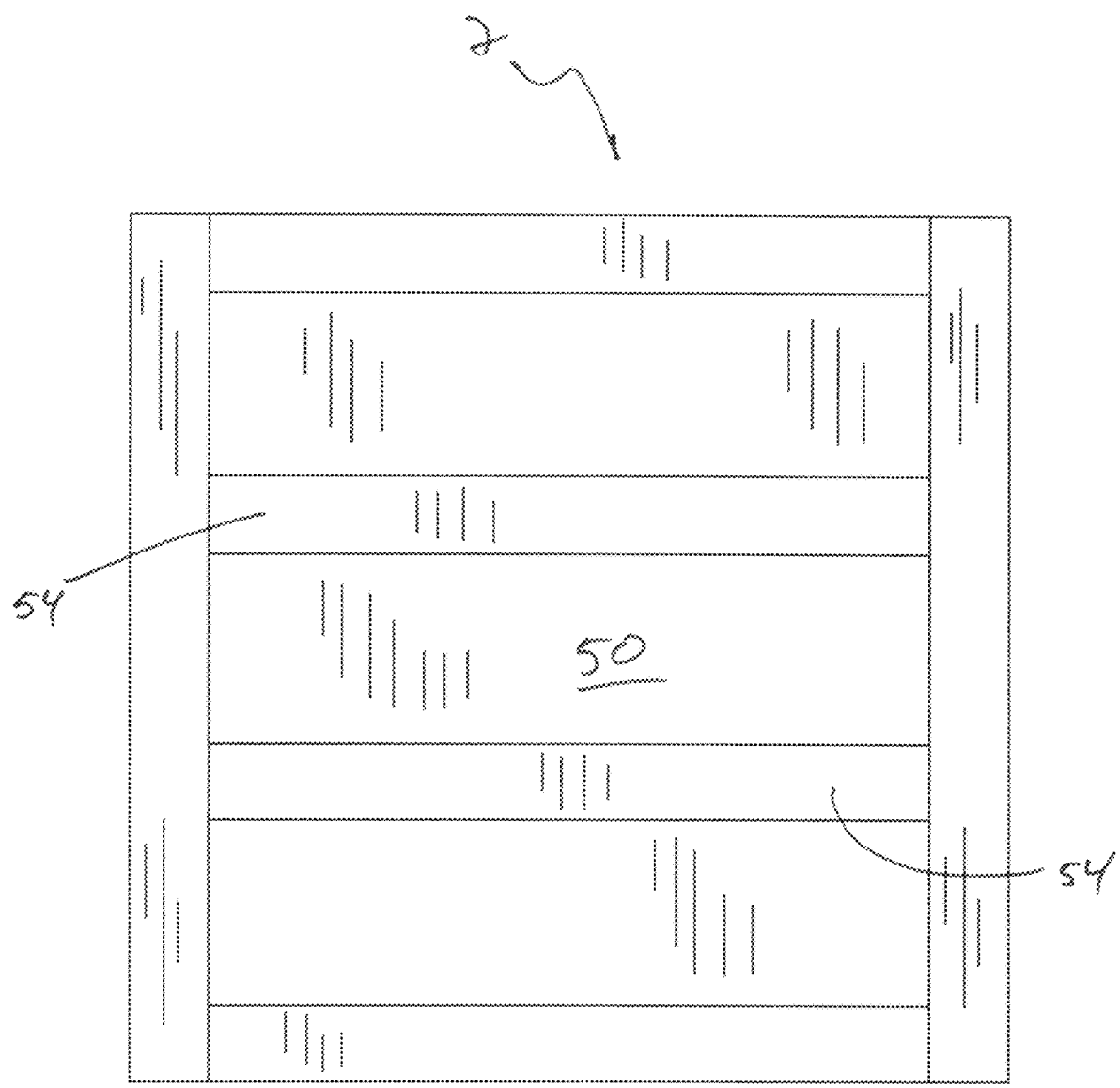
FIG. 2 is a rear plan view of the lighting system shown in FIG. 1.
Figure 3:
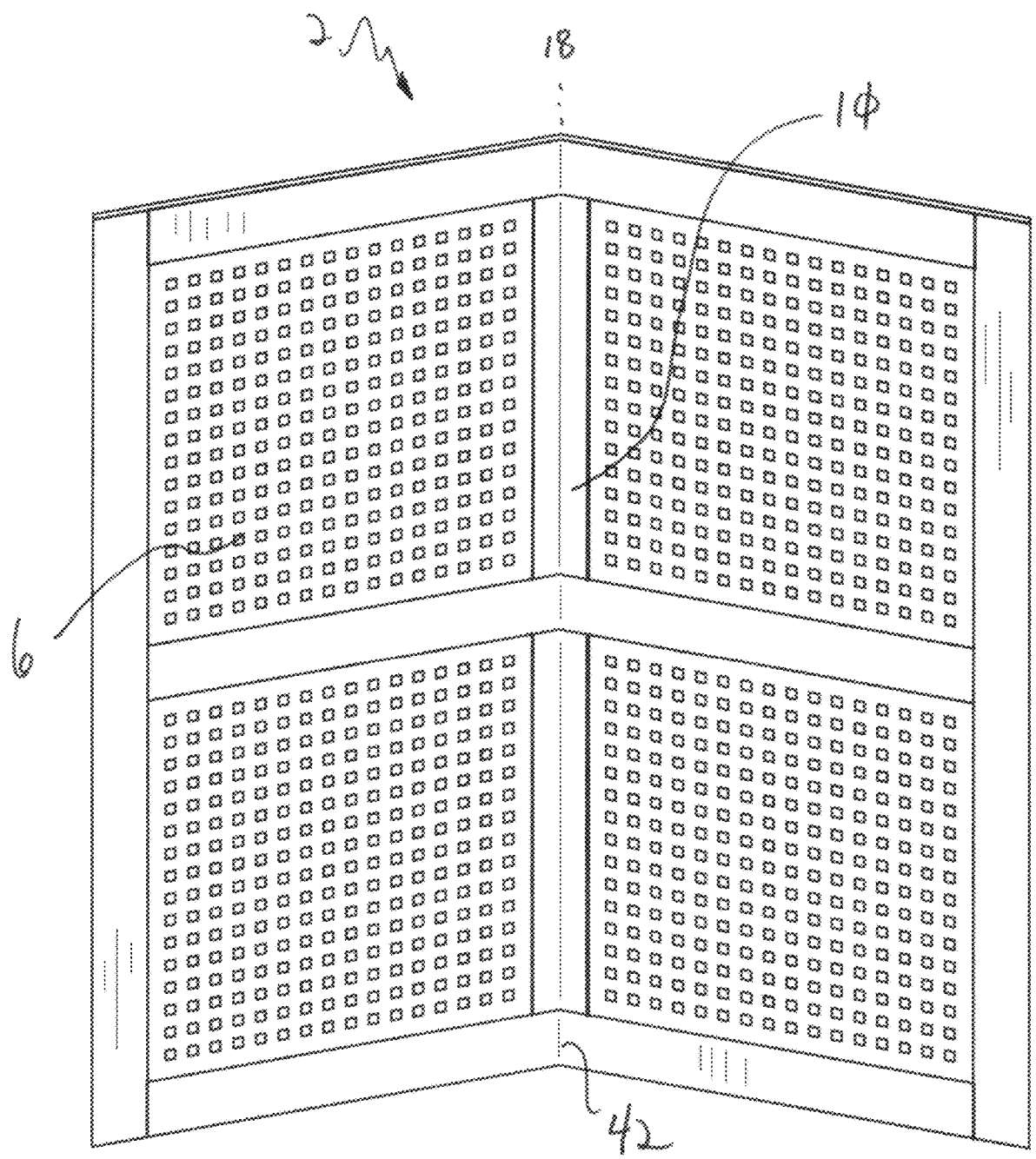
FIG. 3 is a front elevation view showing the lighting system of one embodiment of the present invention shown partially folded.
Figure 4:
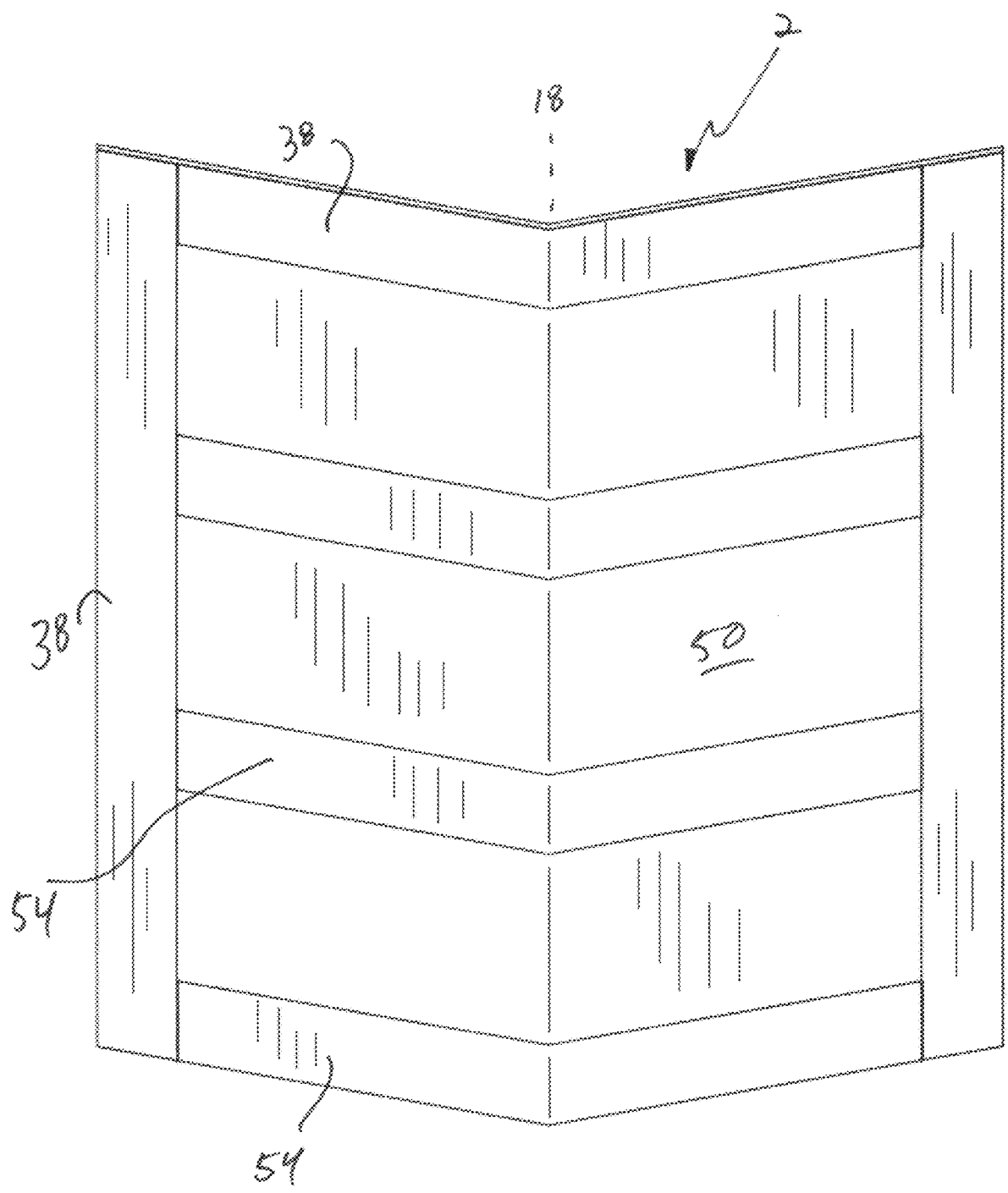
FIG. 4 is a rear elevation view of FIG. 4.
Figure 5:
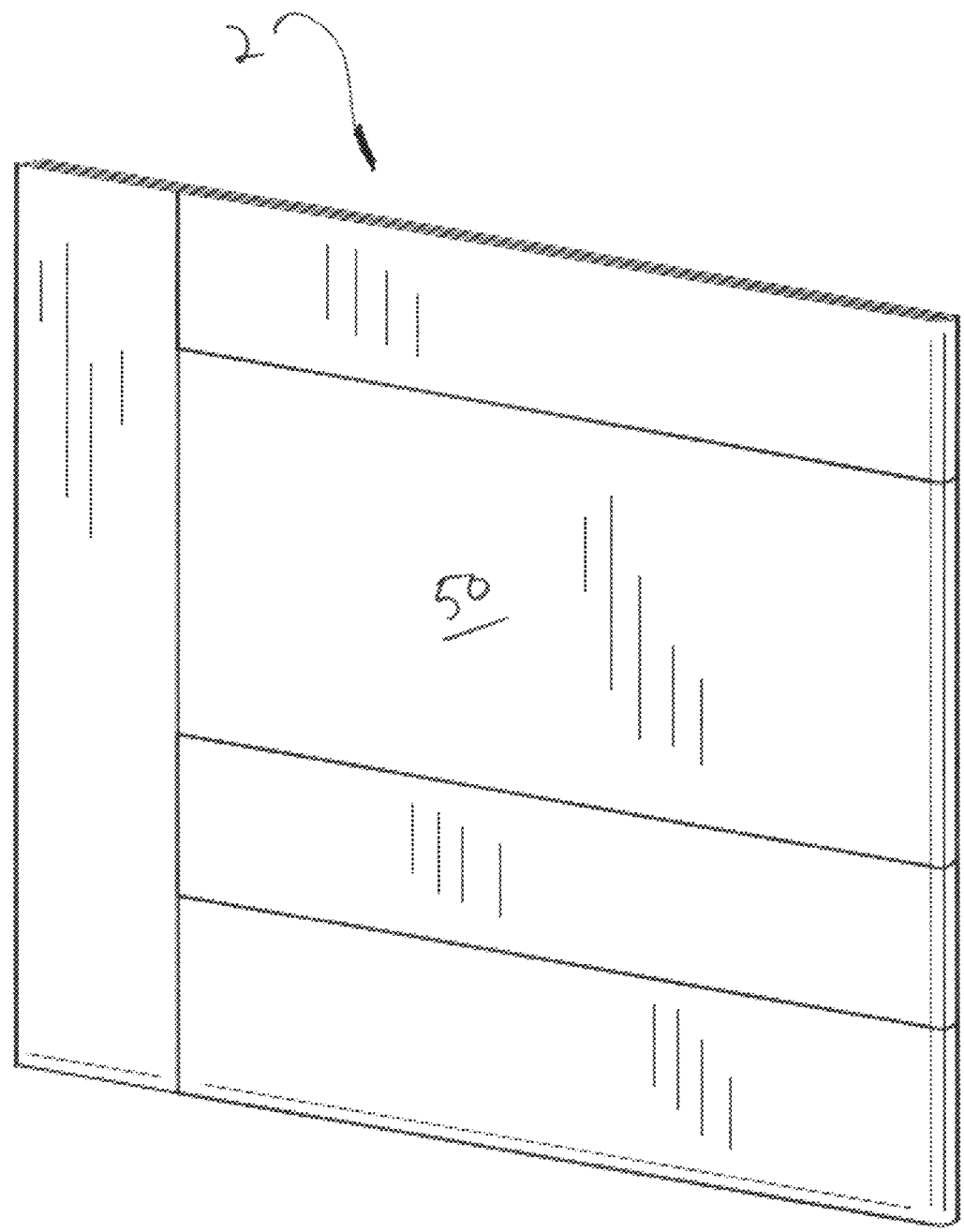
FIG. 5 is a perspective view showing the lighting system in a fully deployed configuration.

As shown in FIGS. 2 and 4, the rear surface 50 of the lighting system 2 is designed to interconnect with a bracket that will fix the orientation of the LED arrays. In this embodiment, a plurality of mounting bracket locations 54 are provided that are comprised of strips of hook and loop material. Those of ordinary skill in the art will appreciate other selective interconnection mechanisms known in the art may be employed without departing from the scope of the invention.

The borders and rear surface of the lighting system are made of material that is foldable yet will provide some rigidity and act as tendons that operatively interconnect the LED arrays. The lighting system 2 may provide a plurality of pockets that receive the LED arrays, thus, if one LED array is damaged or malfunctions, it can be quickly replaced. In other embodiments, the LED arrays are selectively interconnected to each other by a Ziploc® mechanism, Velcro®, snaps, hinges, etc.

Figure 6:
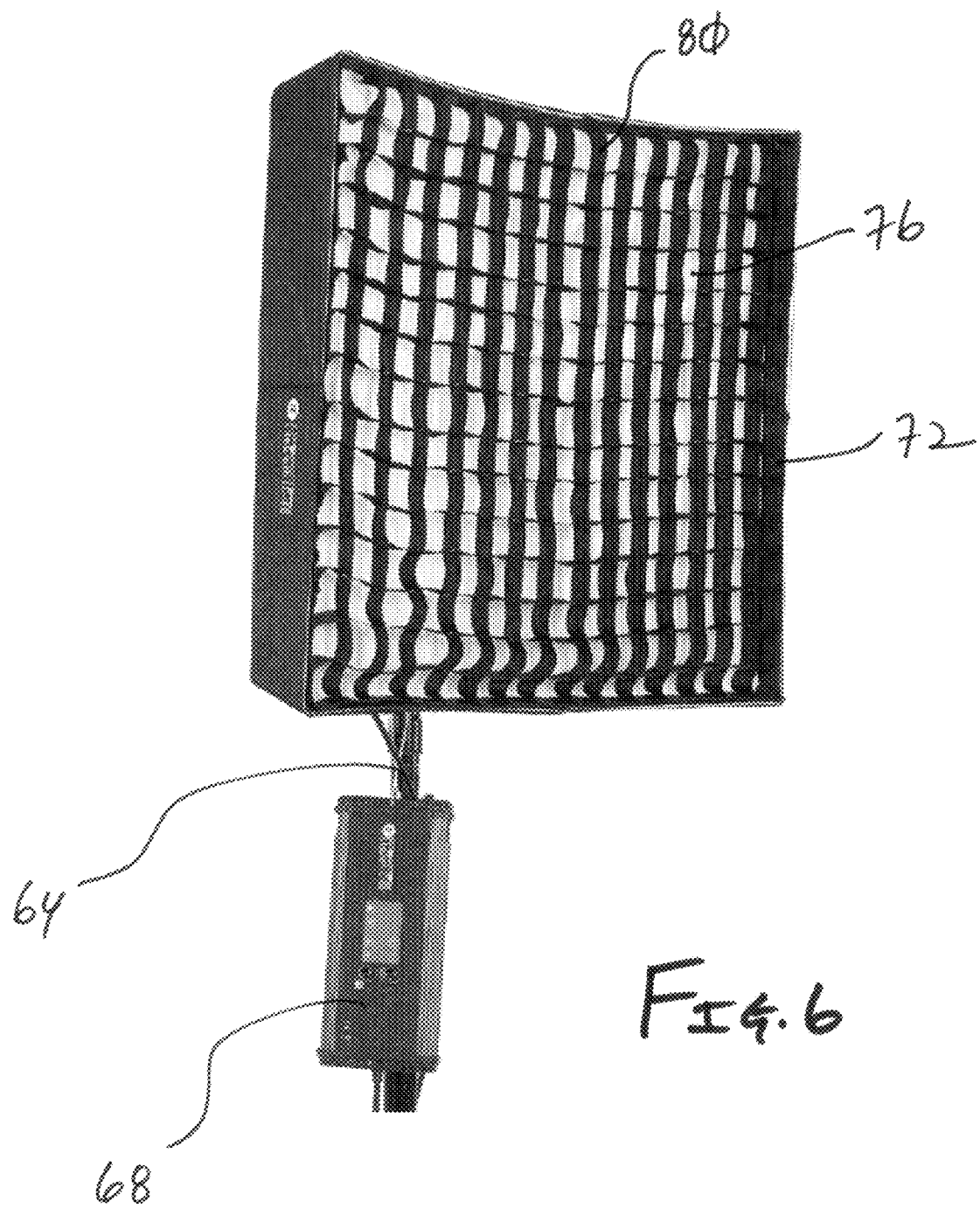
FIG. 6 is a front perspective of a lighting system of one embodiment of the present invention that employs a diffusing layer, a softbox, and diffusing strips.
Figure 7:
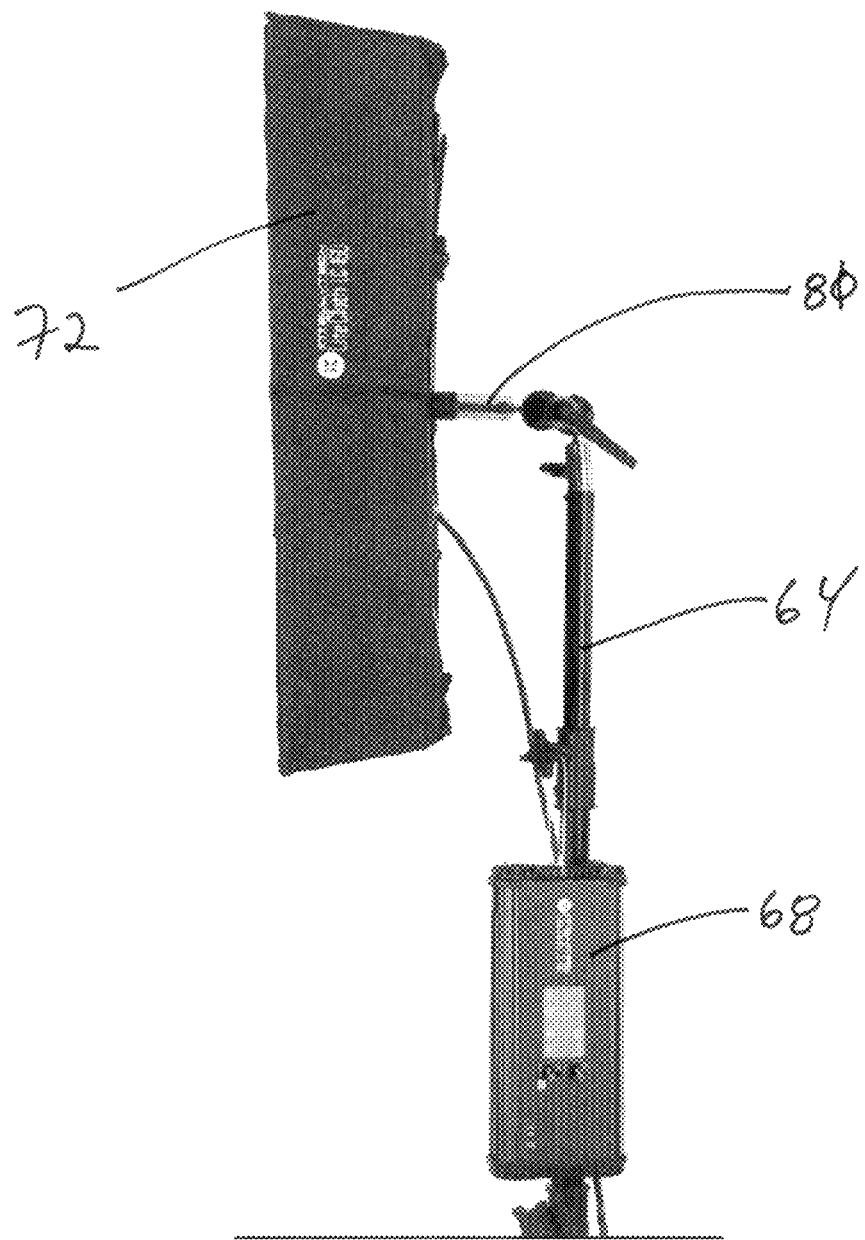
FIG. 7 is a side elevation view of FIG. 6.
Figure 8:
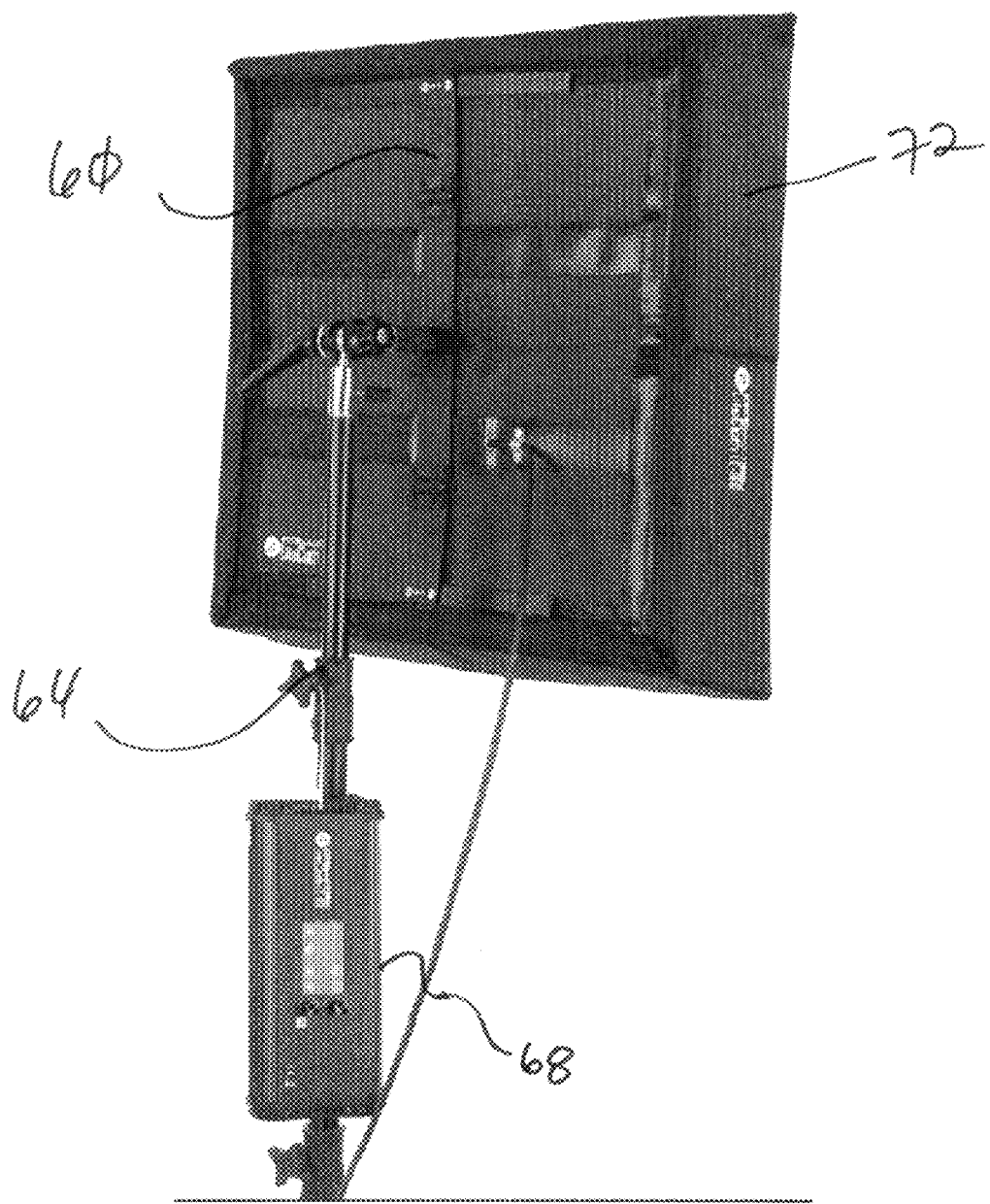
FIG. 8 is a rear perspective view of FIG. 6.

FIGS. 6-8 show the lighting system 2 of one embodiment of the present invention in the deployed state. The lighting system 2 is interconnected to a bracket 60 that will be described in further detail below. The bracket 60 is interconnected to a stand 64 that may also accommodate a controller 68 and/or battery pack for the LED arrays. Those of ordinary skill in the art will appreciate that LED control may be achieved by way of a wireless connection.

Some embodiments of the present invention also employ a selectively foldable lightbox 72 with a portion that interconnects to an outer edge of the lighting system. The lighting box 72 focuses light from the LED arrays to suit user needs. Some embodiments also employ a sheet 76 of diffusing material positioned over the LED arrays and interconnected to the LED array's outer/inner border or the softbox. The light box 72 may also include or selectively receive a plurality diffusing strips 80 that form a matrix over the LED arrays or interconnected diffusing sheet 76.

Figure 9:
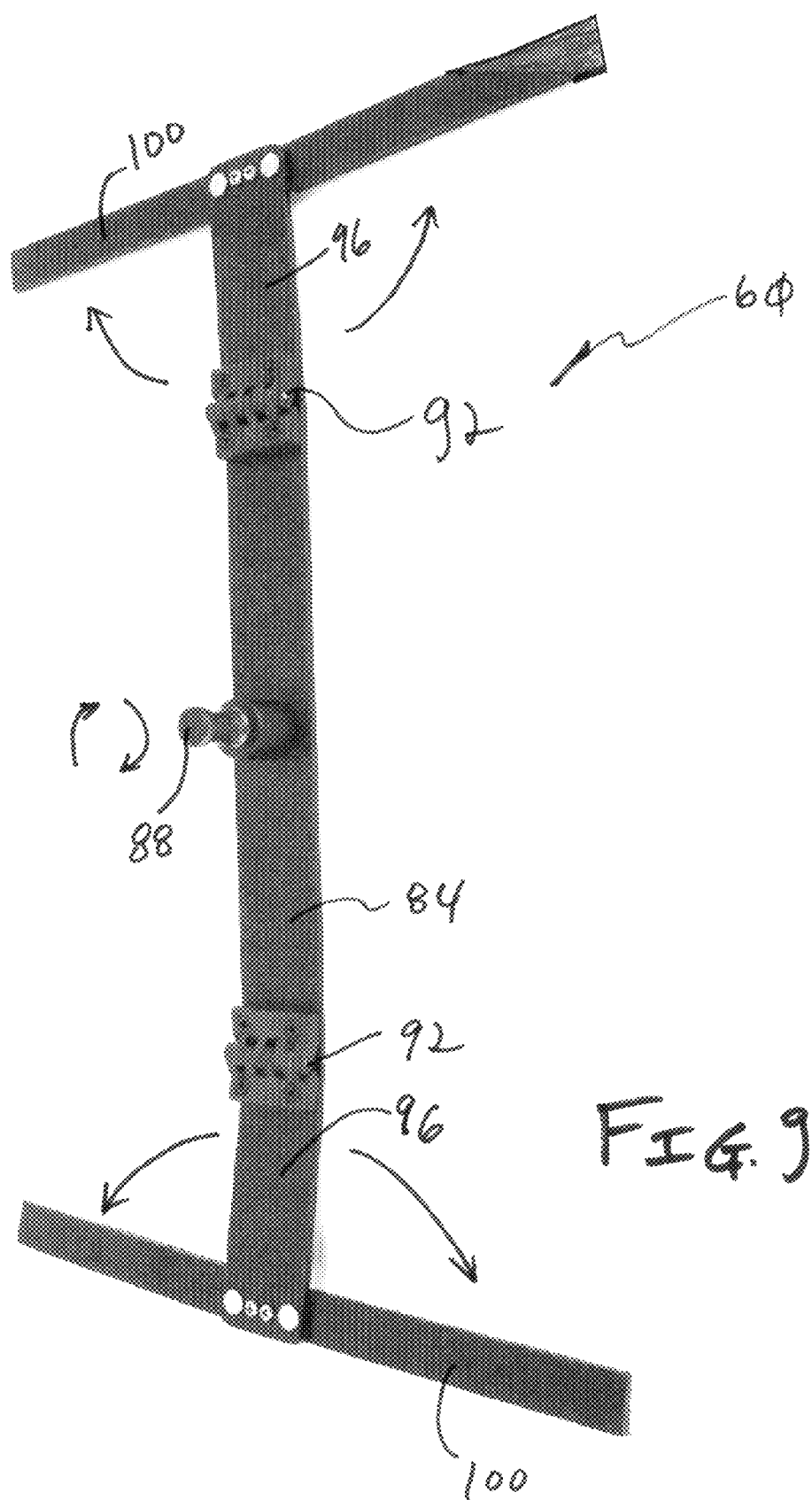
FIG. 9 is a bracket employed by some embodiments the present invention in a first, extended position of use.
Figure 10:
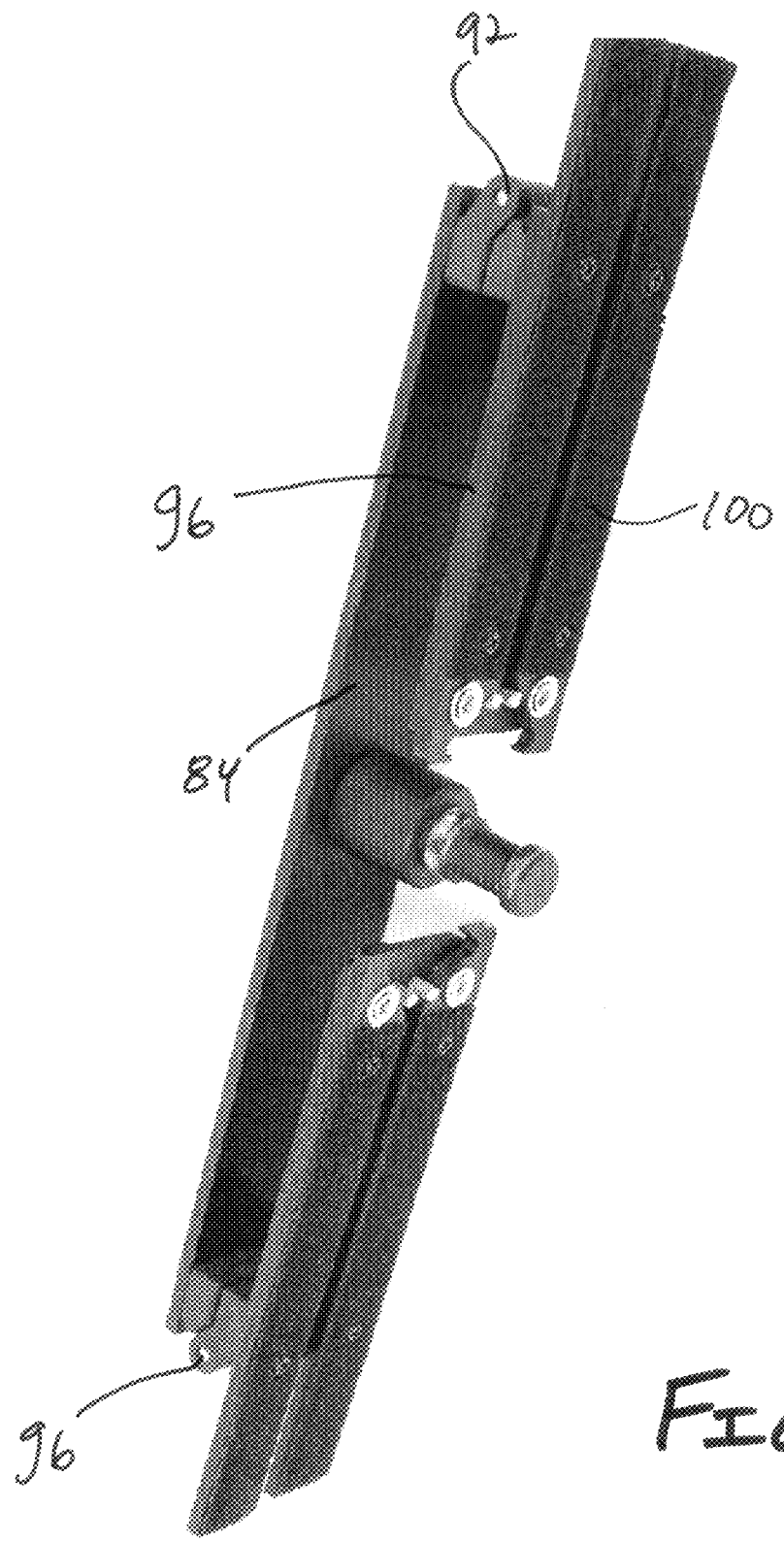
FIG. 10 is the bracket of FIG. 9 shown in a second, folded position of use.
Figure 11:
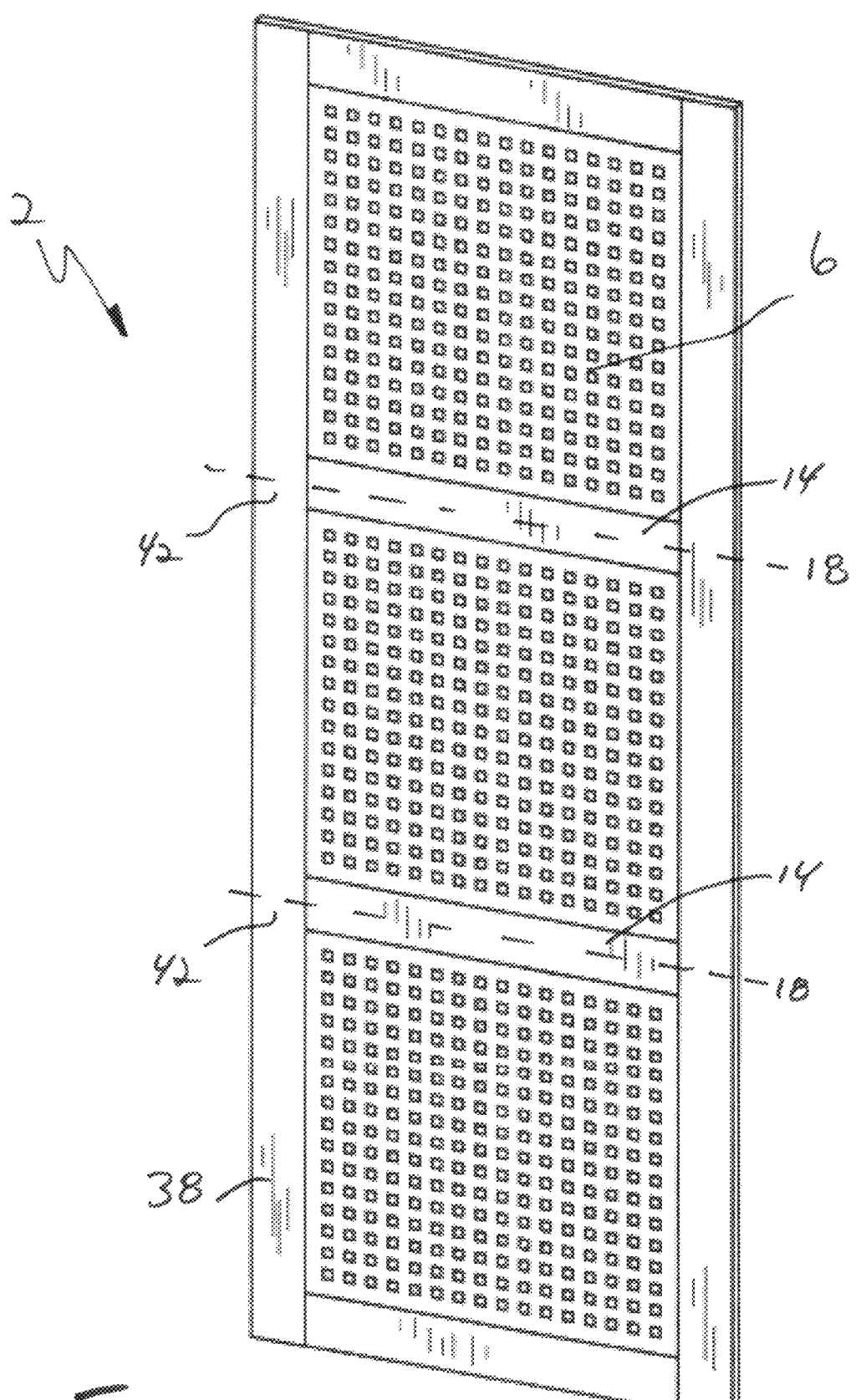
FIG. 11 is a front elevation view of the lighting system of another embodiment of the present invention.
Figure 12:
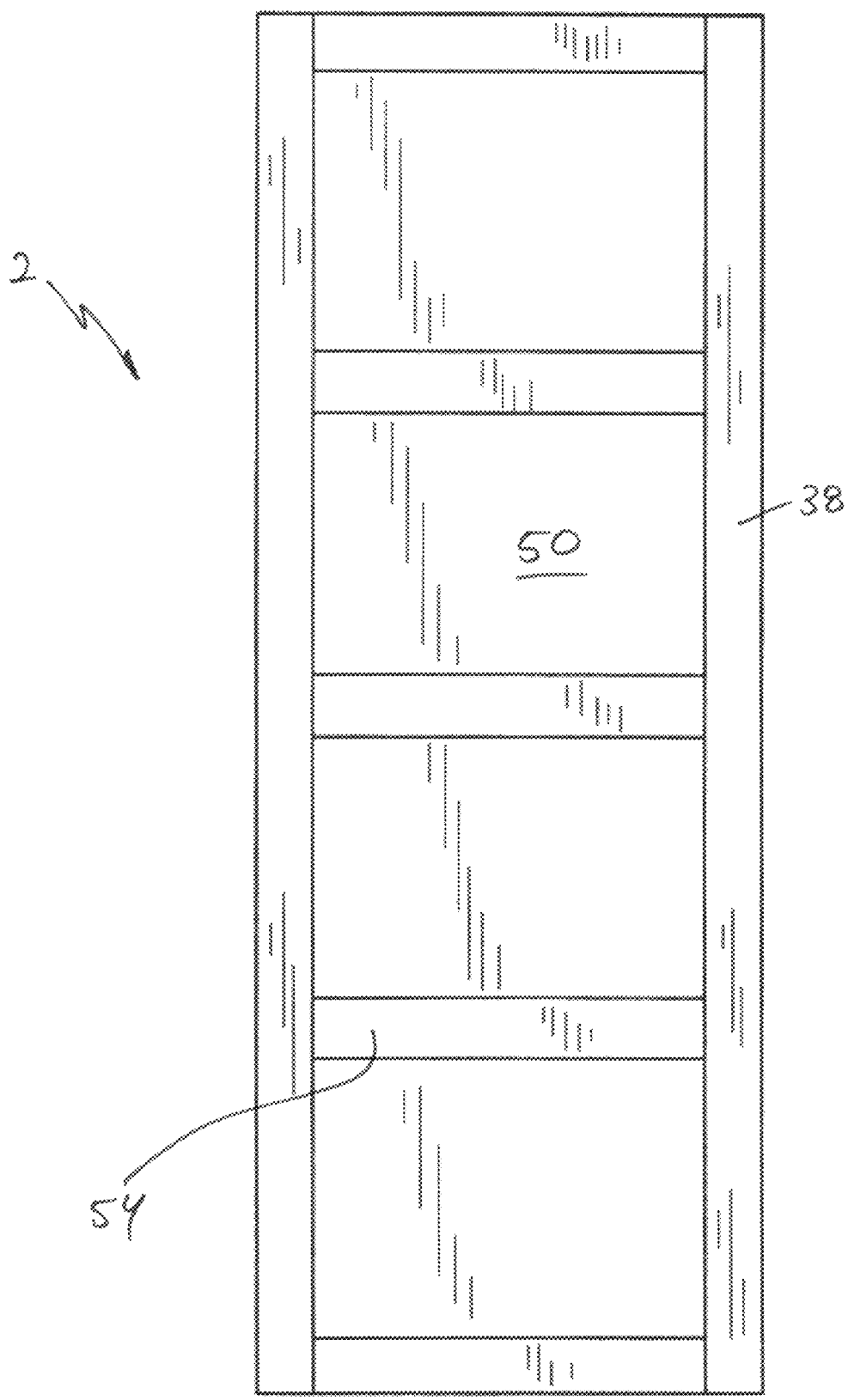
FIG. 12 is a rear plan view of the lighting system shown in FIG. 11.

FIGS. 9 and 10 show the foldable bracket 60 of one embodiment of the present invention. The bracket 60 is comprised of a central portion 84 with a mount 88 adapted to be accepted into a receiver of a stand. The mount 88 may have a cylindrical or spherical end that allows for the central portion 84 to be rotated or tilted relative to the stand. In this embodiment, the central portion 84 includes hinges 92 at each end that are interconnected to secondary portions 96 to allow for rotation inwardly for storage as shown in FIG. 10. To further provide additional structural support to the lighting system, rotatable arms 100 are provided on the ends of the secondary portions 96 that when deployed increase the outer envelope of the bracket 60. One of ordinary skill in the art will appreciate that the secondary portions 96, central portion 100, and arms may have telescoping features to further increase the bracket's envelope and holding capacity. The hinges 92 shown may also be replaced with other mechanisms, such as living hinges or other devices that allow for folding of portions of the bracket upon themselves. Finally, as shown in FIG. 10, the arms and/or the central portion of the bracket may include interconnecting mechanisms, such as corresponding looking loop fastening members that selectively interconnect to the rear surface of the lighting system.

Figure 13:
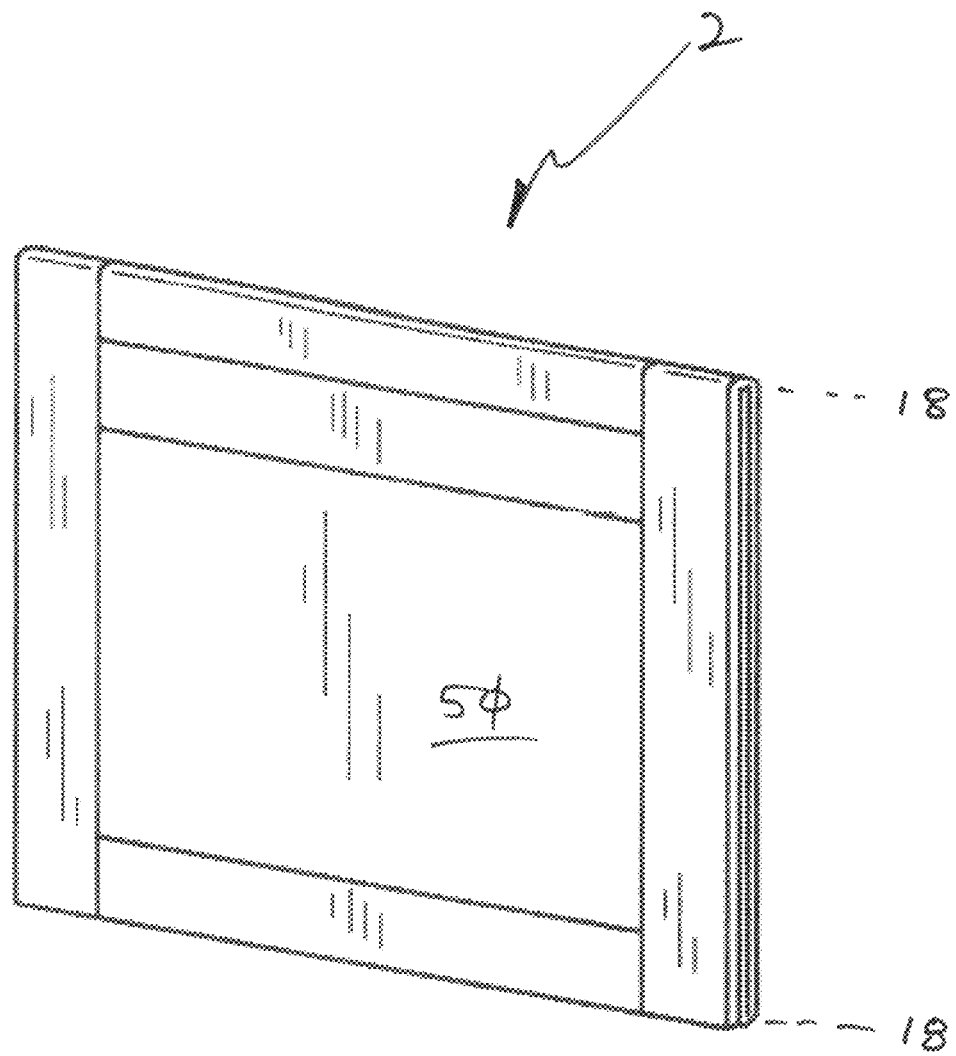
FIG. 13 is a view showing the embodiment of FIG. 11 in a folded configuration.

FIGS. 11-16 show an alternate embodiment of the present invention that employs 3 light-emitting diode arrays. The sliding system is, thus, more rectangular than the lighting system shown and described above. Here, too full lines are provided between adjacent light-emitting diode arrays. Again, some embodiments the present invention employ an outer border to add rigidity to the system or to provide locations for which a bracket can interconnect on the rear side of the lighting system. The borders may have folding portions to allow for the light lighting system to be folded for storage as shown in FIG. 13. As in the embodiment shown above, the rear side of the lighting system employs a plurality of attachment locations for Internet for selective interconnection to a bracket.

Figure 14:
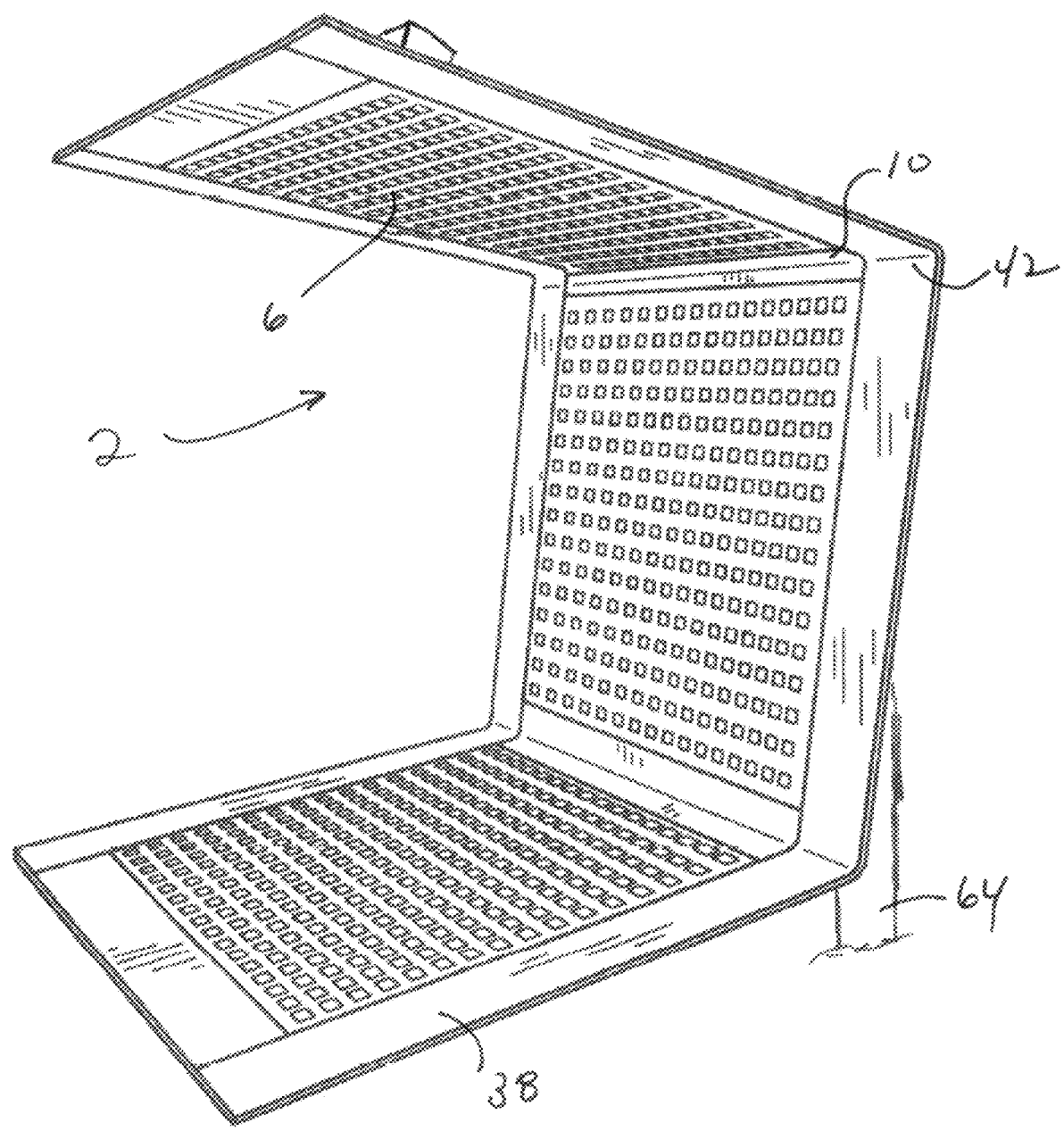
FIG. 14 is a side perspective view of the lighting system of FIG. 11 showing a partially folded configuration.
Figure 15:
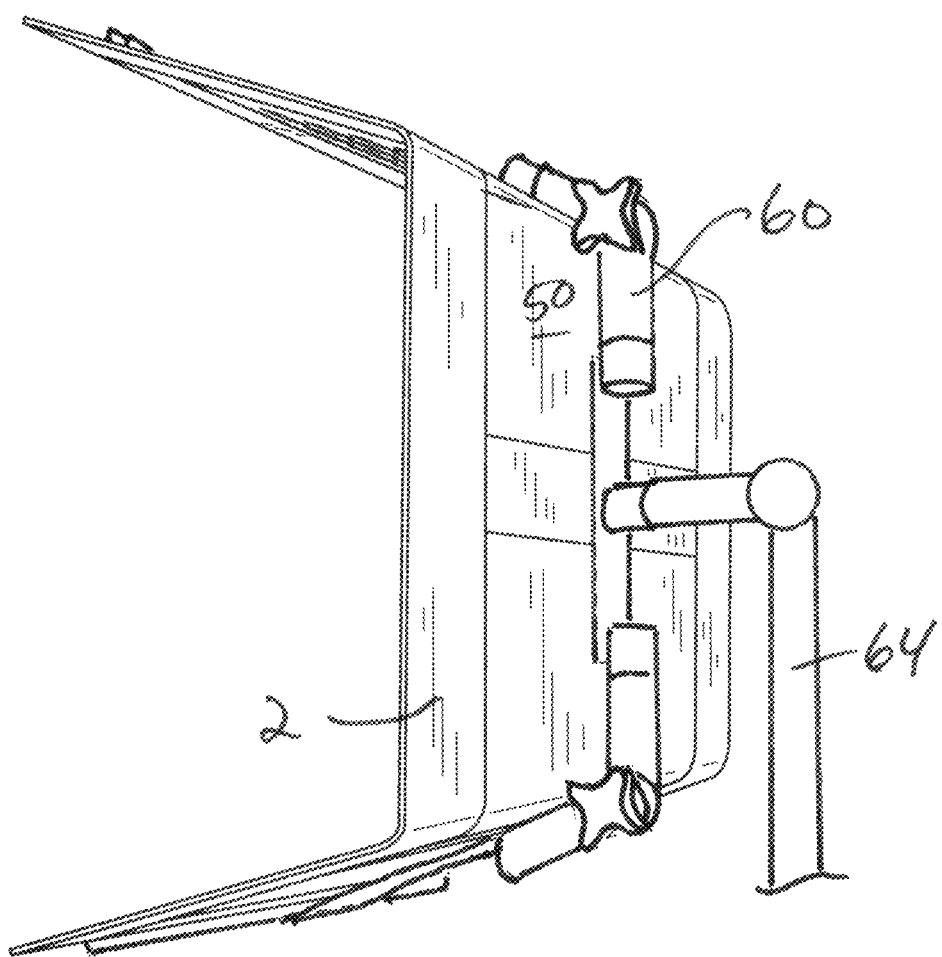
FIG. 15 is a rear perspective view of FIG. 13.

FIGS. 14 and 15 show a bracket 60 interconnected to the rear surface 50 of the lighting system 2. As discussed above with respect to the embodiments of FIGS. 1-10, the bracket 60 has selective interconnection's corresponding selective interconnection methods mechanisms that interface with those of the lighting system. The bracket 60 also allows for the lighting system to be selectively positioned in various ways. For example, the lighting system can position the LED arrays in series top to bottom, left to right, or angled relative to a horizontal surface. In addition, as shown in FIGS. 14 and 15 the lighting arrays may be partially folded upon each other to provide a light effect the user desires.

Figure 16:
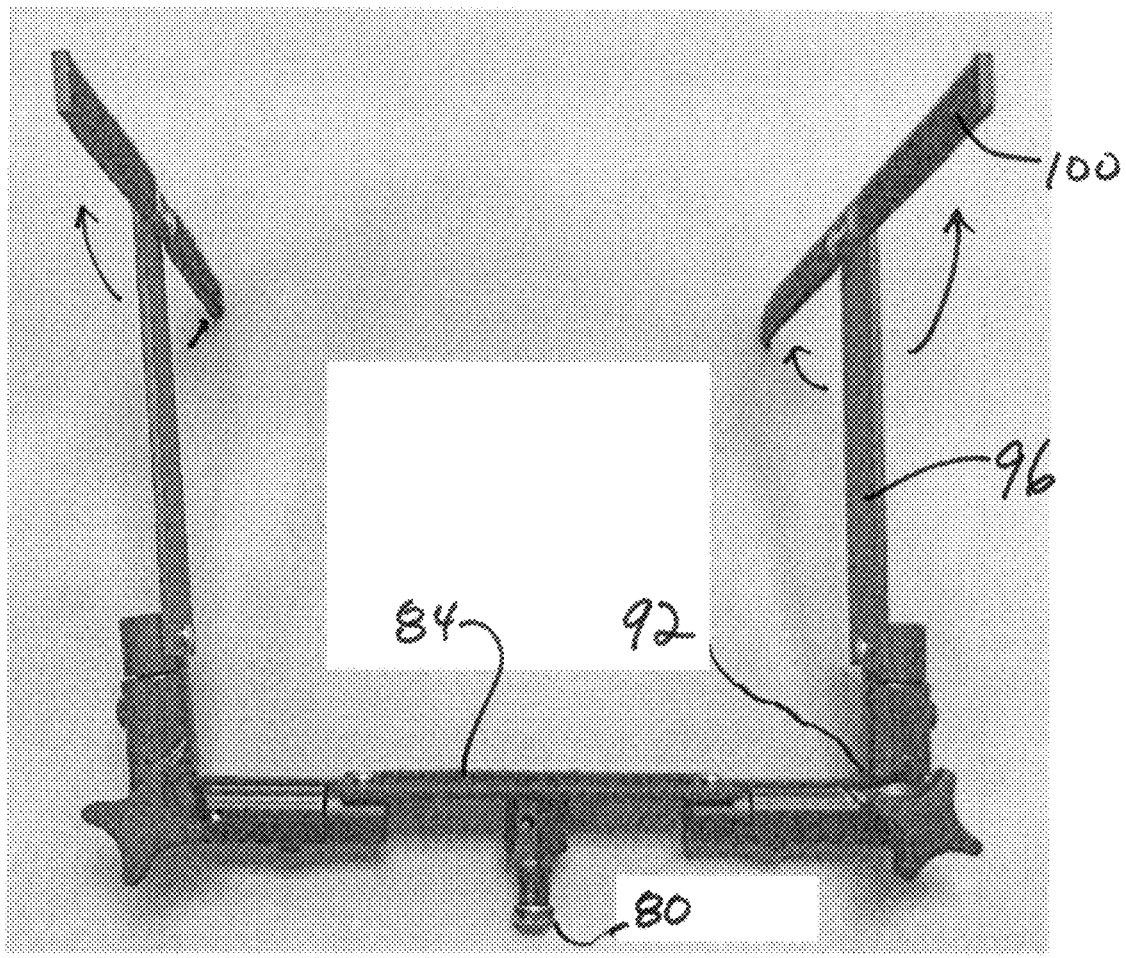
FIG. 16 is a bracket used with the embodiment shown in FIG. 11.
Figure 17:
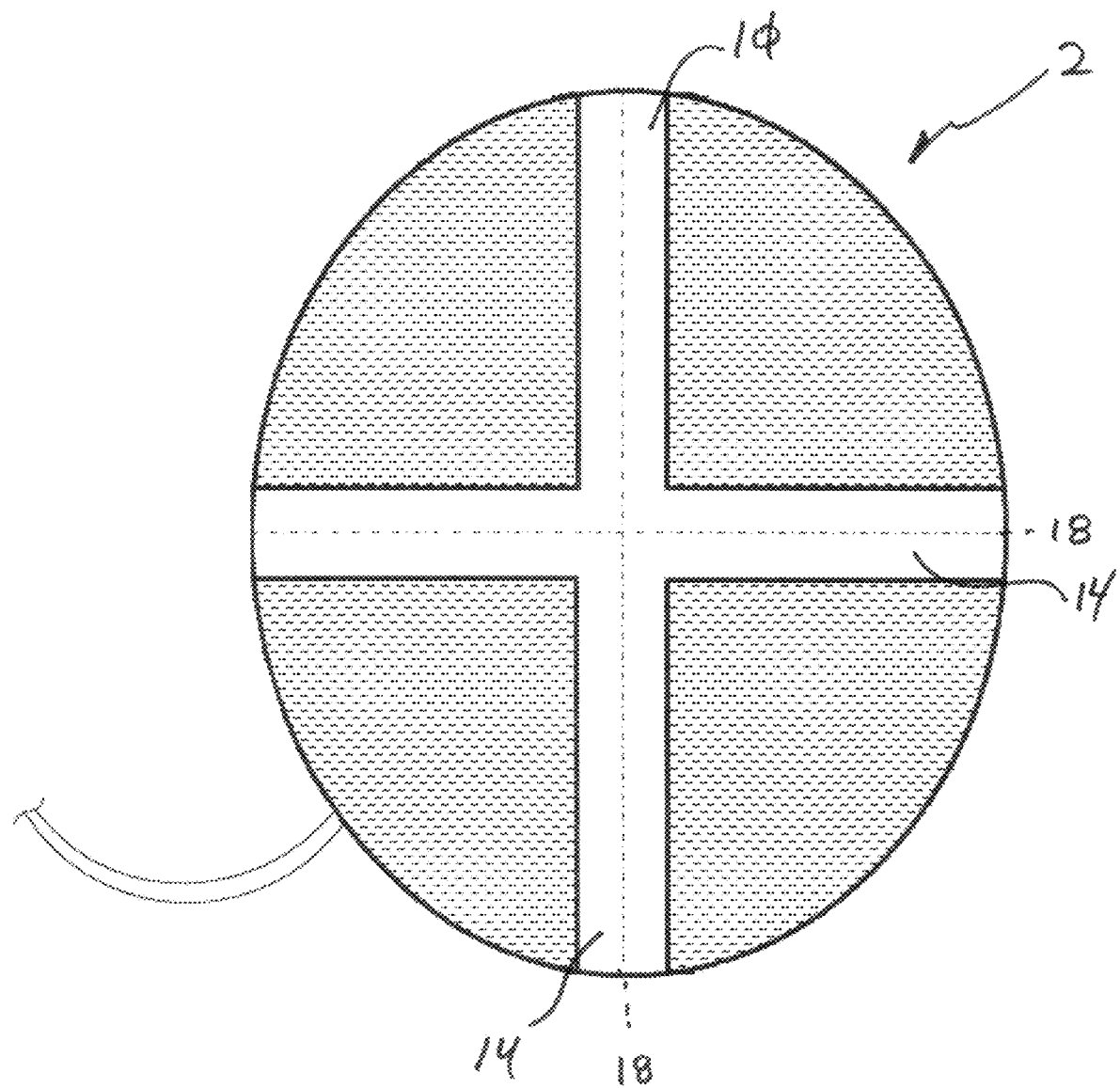
FIG. 17 is a is a front elevation view of another circular embodiment of the present invention.
Figure 18:
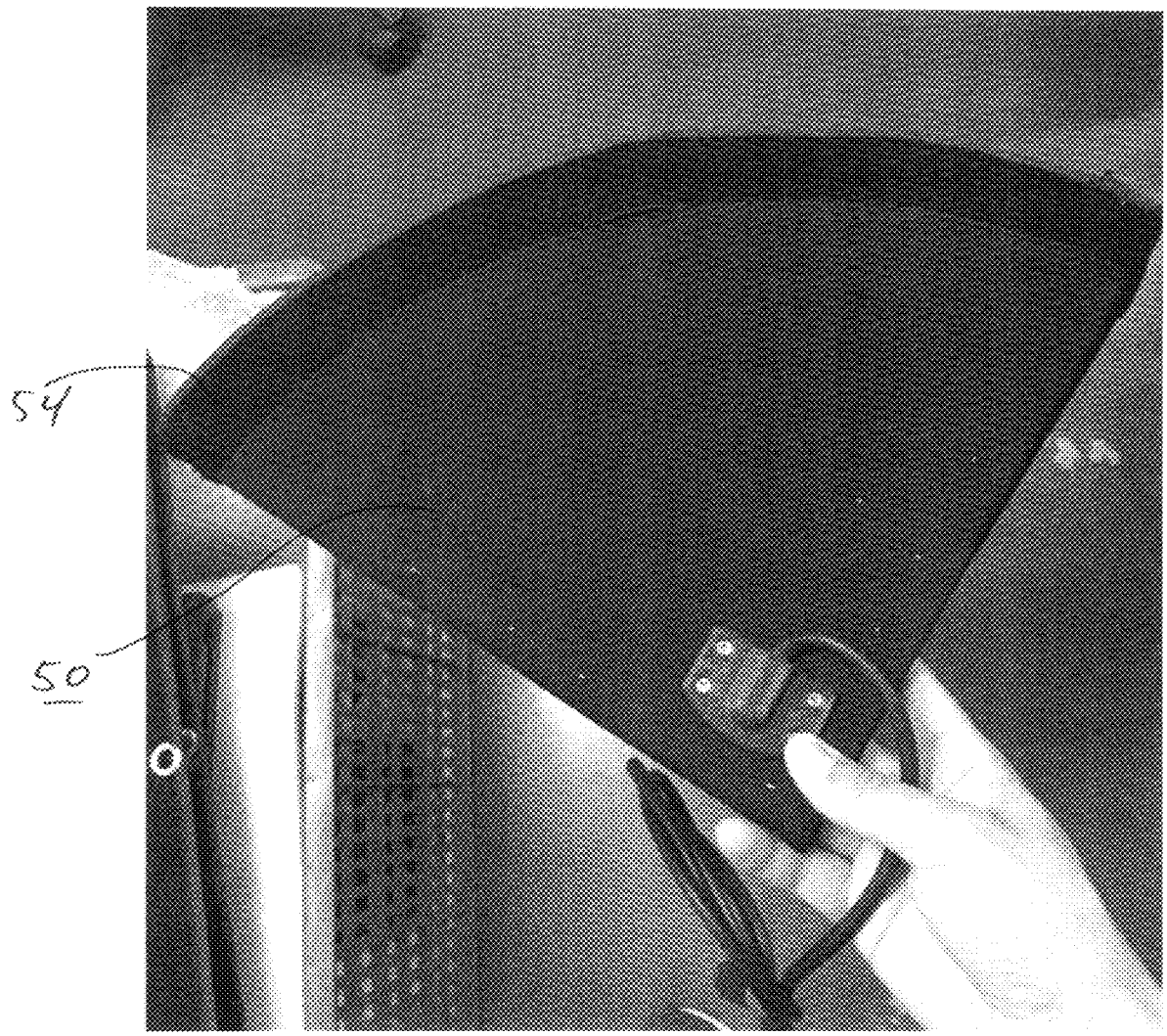
FIG. 18 is a view showing the embodiment of FIG. 17 in a folded configuration.

FIG. 16 shows the bracket 64 of one embodiment of the present invention that is very similar to that described above wherein a mount 80 is provided on a center portion 84. Secondary portions 96 are also provided that include adjustable hinges 92 that allows for secondary portions 96 of the bracket to be angled relative to the central portion. A knob 104 that fixes the orientation of the secondary portions 96 relative to the central portion 84 is also included. The secondary portions 84 also have arms 100 that selectively rotate from the secondary portions to increase the bracket envelope. One of ordinary skill in the art will appreciate that the bracket may also be disassembled to facilitate storage. FIGS. 17 and 18 show yet another embodiment of the present invention and illustrate to those of ordinary skill in the art that the lighting system 2 may have many shapes. This embodiment of the present invention shows a lighting system that has a circular outer perimeter wherein pie-shaped LED arrays 6 are provided. The several LED arrays 6 are separated by borders 10 that include folding portions to allow the lighting system to be configured into a single pie-shape as shown in FIG. 18. As in the other embodiments, a power and/or control cable may be provided on the rear surface of the LED arrays to interconnect the same.

Figure 19:
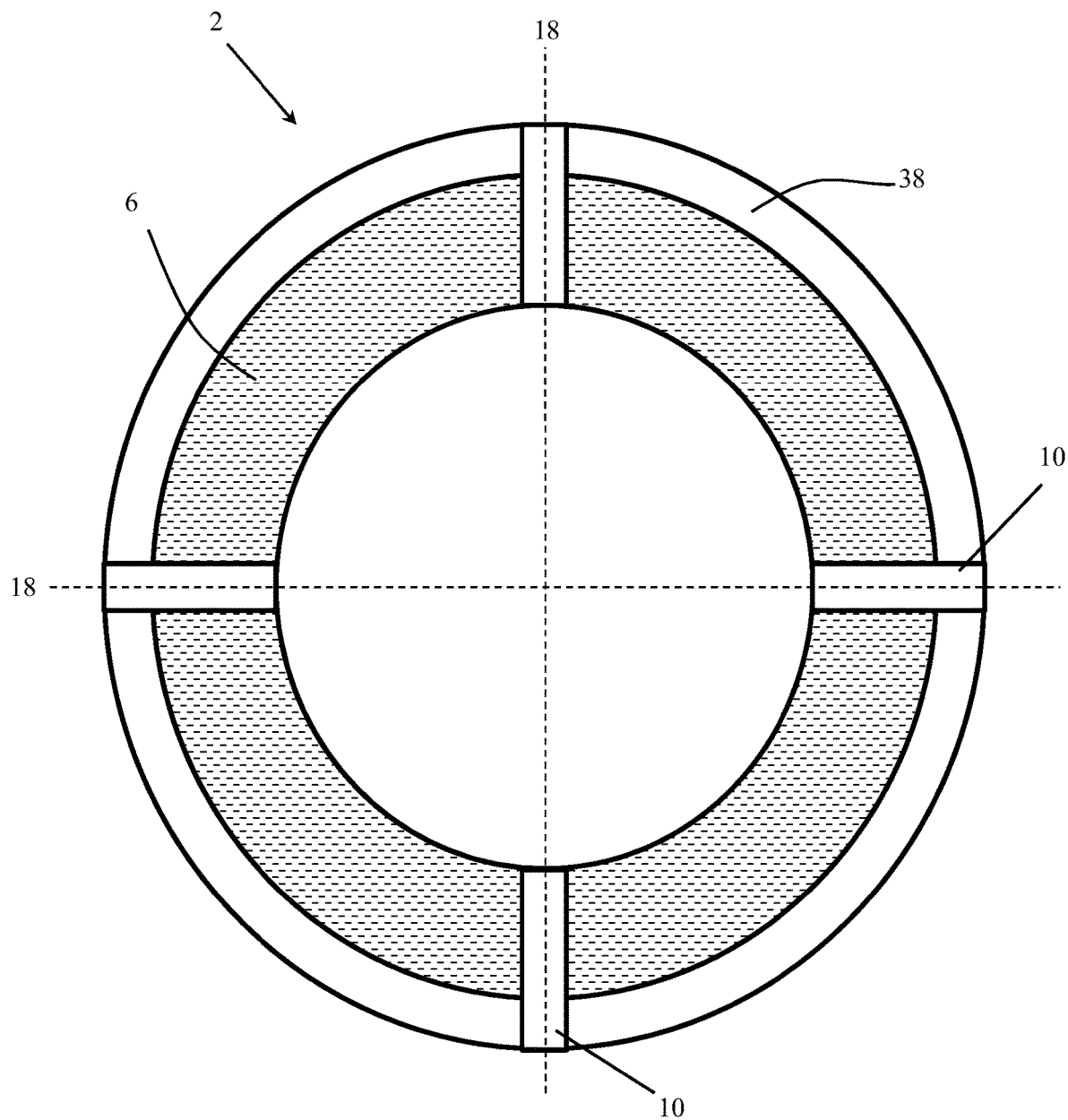
FIG. 19 is a front elevation view of another ring-shaped embodiment of the present invention.
Figure 20:
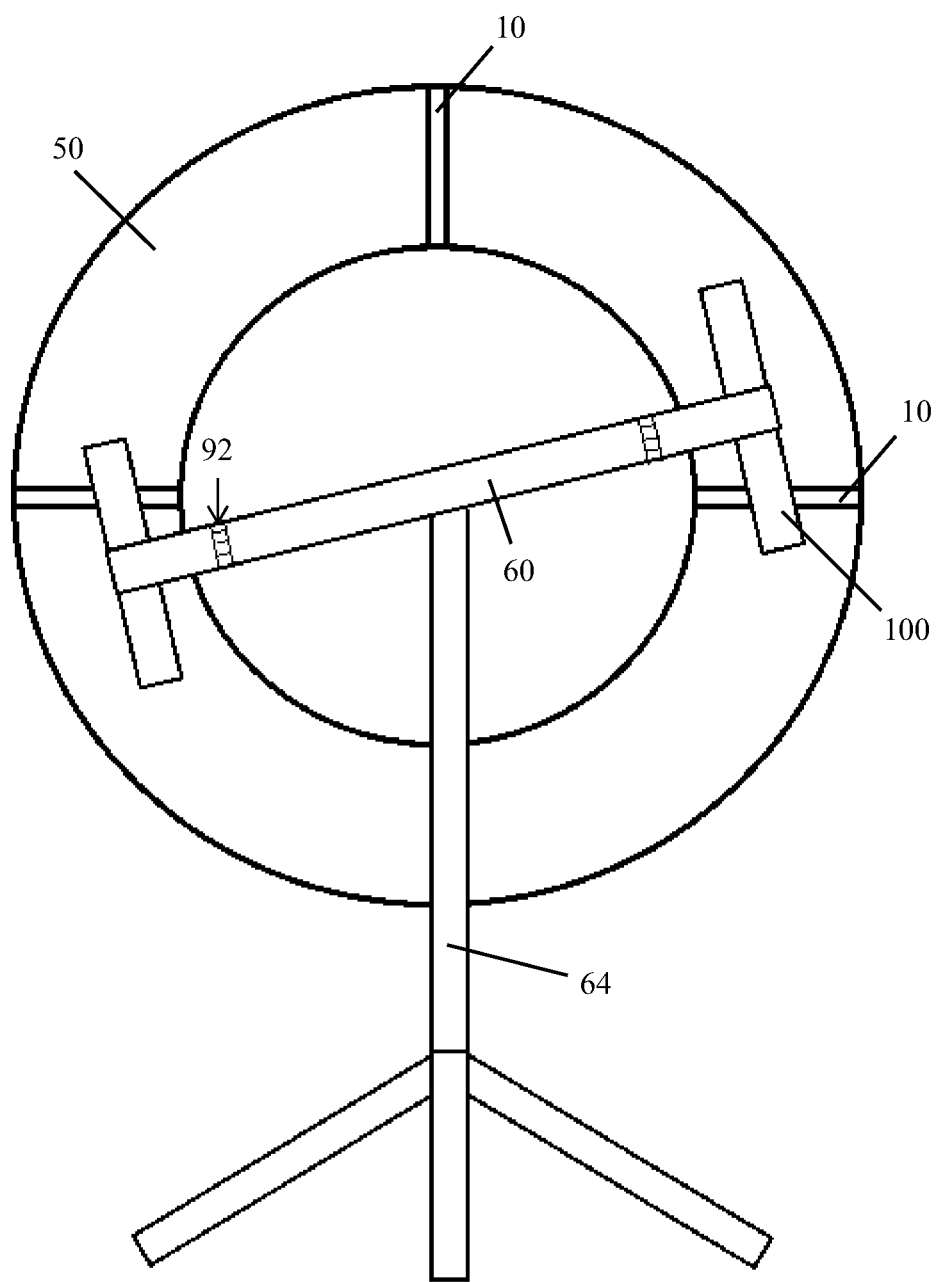
FIG. 20 is a rear elevation view of a bracket and stand configured to secure the lighting system of some embodiments of the present invention.
Figure 21:
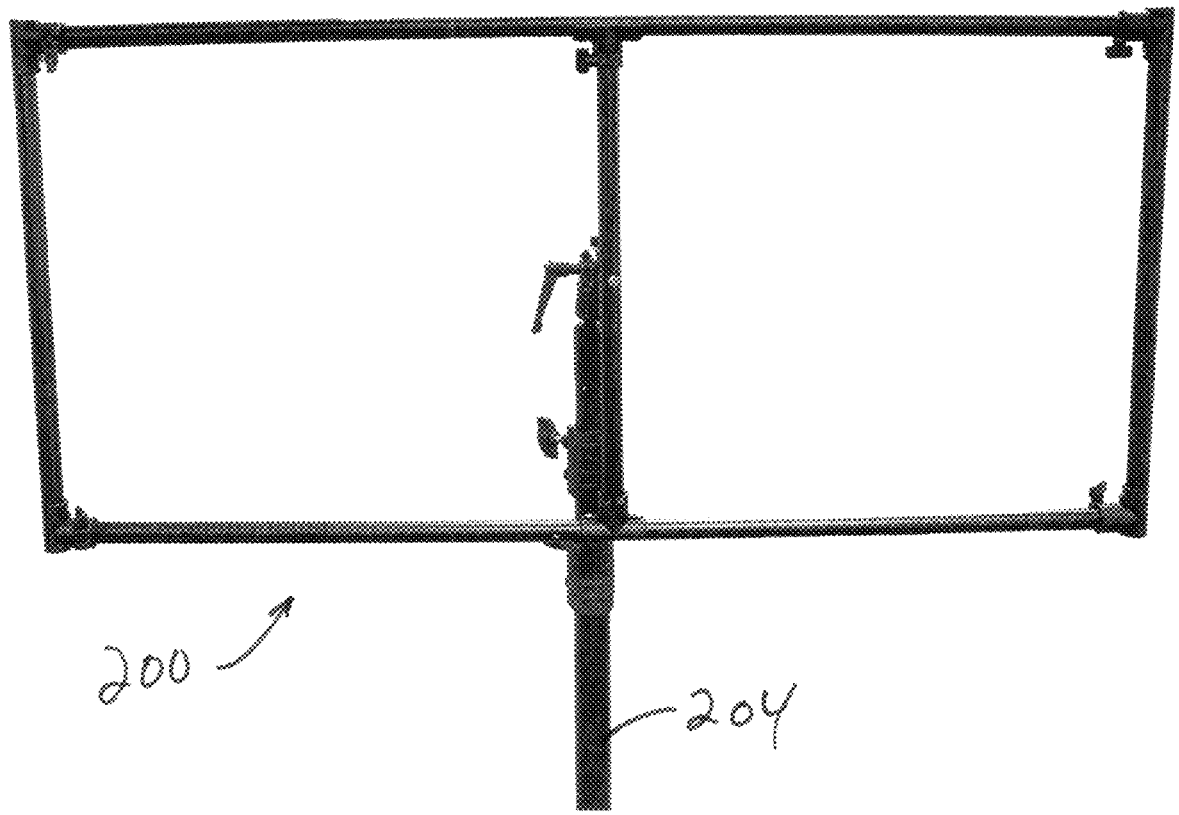
FIG. 21 is a front elevation view of a mounting bracket employed by some embodiments the present invention.

FIGS. 19 and 20 show another ring-shaped embodiment of the present invention. Here, arcuate LED arrays 6 are interconnected by a folding border therebetween. Accordingly, this light system 2 folds into an arcuate-shaped configuration for storage. FIG. 20 shows the back side of the embodiments of FIG. 19, wherein a bracket 60 similar to those described above is used to interconnect to the rear surface of the lighting system. The bracket 60 may also include a mechanism to interconnect to a camera such that the ring of light provided by the lighting system of FIG. 19 encircles the camera.

Figure 22:
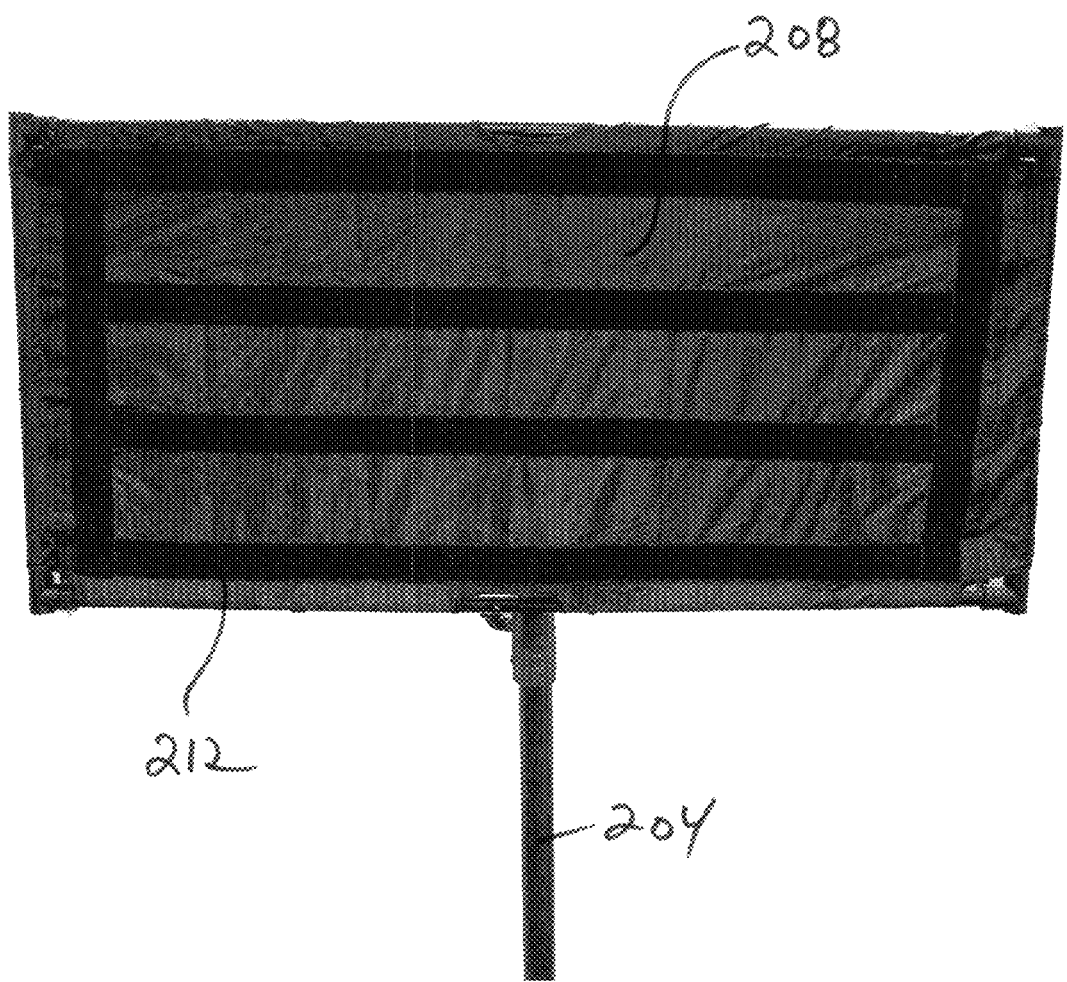
FIG. 22 is a front elevation view of a mounting panel of one embodiment of the present invention connected to the mounting bracket of FIG. 21.

FIGS. 21-24 show yet another embodiment of the present invention that facilitates the use of the lighting systems described above. Here, a frame 200 is provided that interconnects to a stand 204. Preferably, the frame 200 is interconnected such a way to provide selective rotation or tilting thereof relative to the stand. In some embodiments of the present invention, the frame includes tubular portions that are selectively disconnected to facilitate storage. FIG. 22 shows a mounting panel 208 interconnected to the frame. The mounting panel includes a plurality of interconnection locations 212 for receipt of comparable interconnection mechanisms on the lighting systems. The mounting panel 212 is made of a soft material and adapted to fold or roll.

Figure 23:
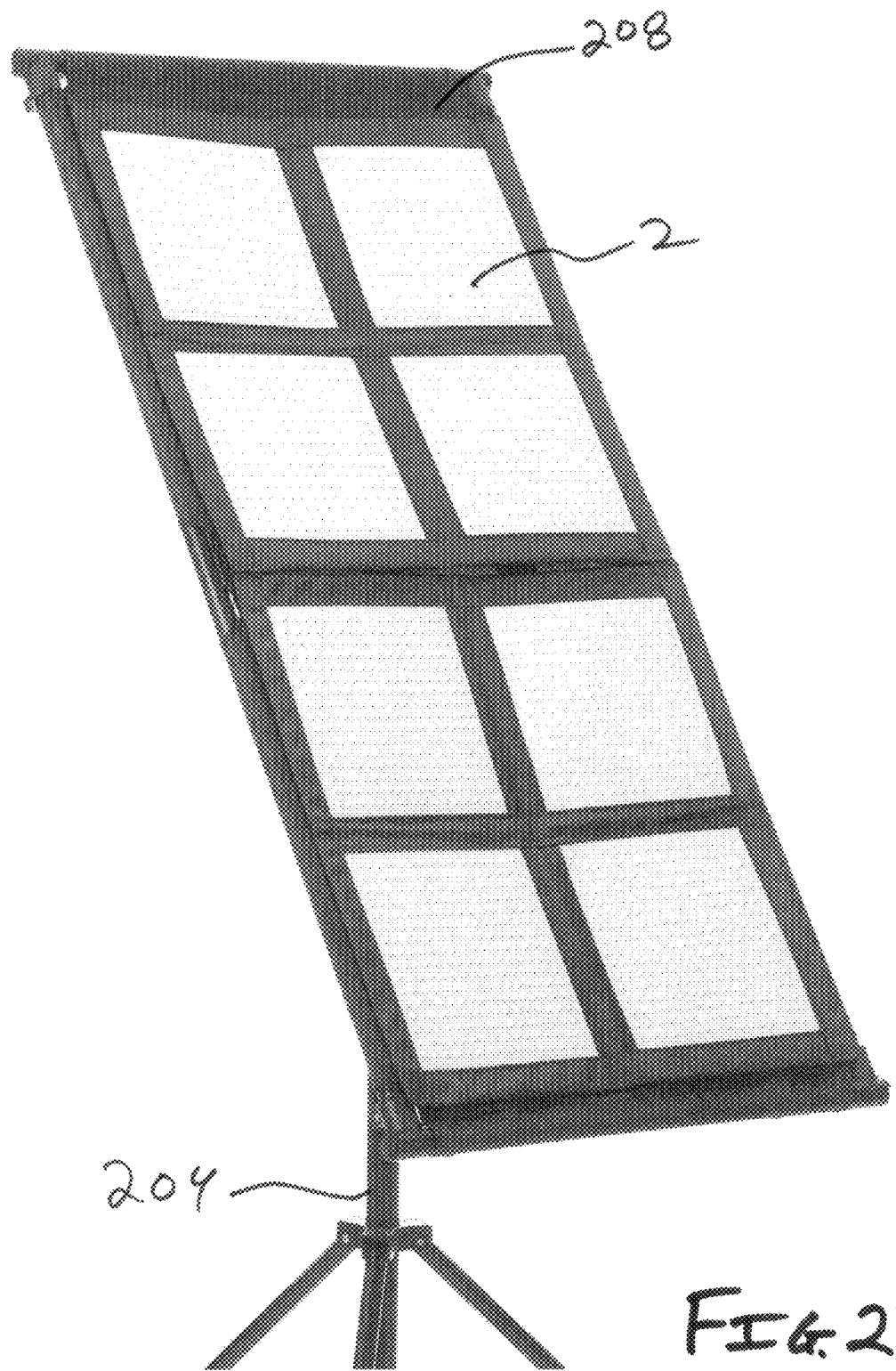
FIG. 23 is a perspective view showing a plurality of lighting systems secured to the mounting panel and the bracket of FIGS. 21 and 22 respectively.
Figure 24:
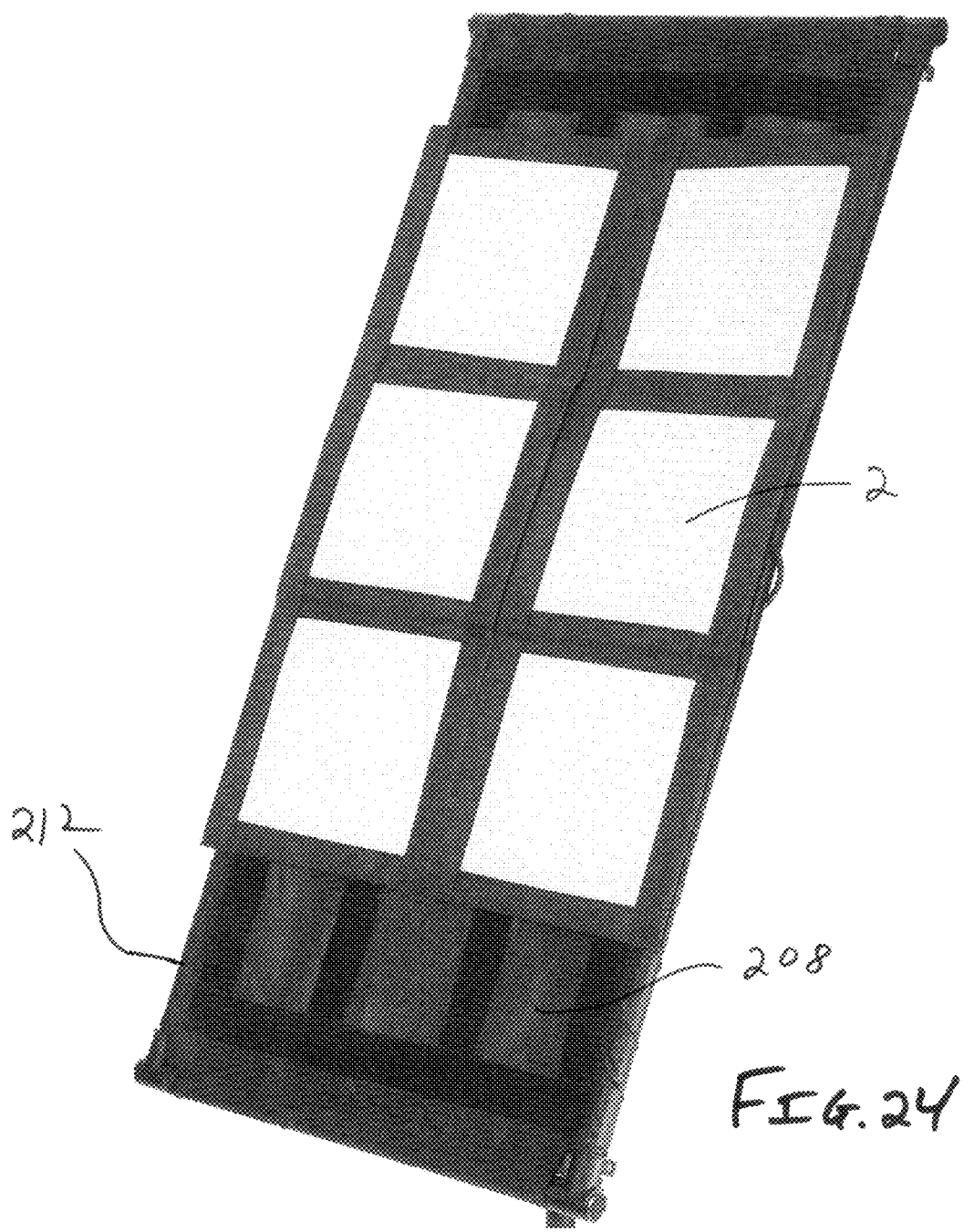
FIG. 24 is another perspective view showing a plurality of lighting systems of another embodiment of the present invention secured to the mounting panel bracket of FIGS. 21 and 22, respectively.

FIGS. 23 and 24 show the mounting's panel 212 of FIG. 22 configured to secure the foldable lighting systems 2 described above. For example, FIG. 23 shows 2×2 lighting system secured to the mounting panel 208 to provide additional lighting options to the user. FIG. 24 shows the lighting panels of FIGS. to 11-13 interconnected to the mounting panel 208. In some embodiments the frame of FIG. 21 includes selectively-foldable arms that increase its outer perimeter so that a larger mounting panel can be received.

While various embodiments of the present invention have been described in detail, it is apparent that modifications and alterations of those embodiments will occur to those skilled in the art. It is to be expressly understood that such modifications and alterations are within the scope and spirit of the present invention, as set forth in the following claims. Further, it is to be understood that the invention(s) described herein is not limited in its application to the details of construction and the arrangement of components set forth in the preceding description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

What is claimed is:

1. A light emitting device, comprising:
a first continuous surface;
a first light emitting diode (LED) array interconnected to the first continuous surface;
a second LED array interconnected to the first surface;
a foldable border between the first LED array and the second LED array, wherein the first LED array and the second LED array are configured to have a first position of use, whereby the first LED array and the second LED array are aligned, and a second positioned of use, whereby the first LED array is positioned over the second LED array; and
a second surface having at least one interconnection location configured to receive a bracket.

2. The light emitting device of claim 1, further comprising a diffusing material positioned over at least one of the first LED array and the second LED array.

3. The light emitting device of claim 1, further comprising a softbox interconnected to the first continuous surface or the second surface, the softbox having a surface that extends from the first continuous surface.

4. The light emitting device of claim 3, wherein the softbox includes a series of orthogonally oriented strips positioned within the surface that extends from the first continuous surface.

5. The light emitting device of claim 1, wherein the foldable border is a first foldable border, and further comprising a third LED array interconnected to the second LED array by a second foldable border, the first foldable border and the second foldable border defining a first fold line and a second fold line, wherein the third LED array is configured to rest on the first LED array or the second LED array when the light emitting device is in the second position of use.

6. The light emitting device of claim 1, wherein the foldable border is a first foldable border, and further comprising a third LED array and a fourth LED array connected to the first LED array and the second LED array to define a 2 by 2 grid, and wherein a second foldable boundary is provided that is orthogonal to the first foldable boundary.

7. The light emitting device of claim 1, wherein the at least one interconnection location is configured to receive a bracket comprising:
a first portion with a mount extending therefrom,
a second portion operatively interconnected on a first end to a first end of the first portion,
a third portion operatively interconnected on a first end to a second end of the first portion,
a first arm operatively interconnected to a second end of the second portion,
a second arm operatively interconnected to a second end of the second portion,
a third arm operatively interconnected to a second end of the third portion, and
a fourth arm operatively interconnected to a second end of the third portion.

8. The light emitting device of claim 7, wherein the first arm and the second arm are configured to fold over the second portion, the third arm and the fourth arm are configured to fold over the third portion, the second portion is configured to fold over the first portion, and the third portion is configured to fold over the first portion.

9. The light emitting device of claim 7, wherein a surface opposite the mount includes a material adapted to selectively interconnect to the at least one interconnection location of the second surface of the light emitting device.

10. A light emitting device, comprising:
a first continuous surface;
a first light emitting diode (LED) array interconnected to the first continuous surface;
a second LED array interconnected to the first continuous surface;
a foldable border between the first LED array and the second LED array, wherein the first LED array and the second LED array are configured to have a first position of use, whereby the first LED array and the second LED array are aligned, and a second positioned of use, whereby the first LED array is positioned over the second LED array; and
a second surface having at least one interconnection location configured to receive a bracket, comprising:
a first portion with a mount extending therefrom,
a second portion operatively interconnected on a first end to a first end of the first portion,
a third portion operatively interconnected on a first end to a second end of the first portion,
a first arm operatively interconnected to a second end of the second portion,
a second arm operatively interconnected to a second end of the second portion,
a third arm operatively interconnected to a second end of the third portion,
a fourth arm operatively interconnected to a second end of the third portion,
wherein the first arm and the second arm are configured to fold over the second portion, the third arm and the fourth arm are configured to fold over the third portion, the second portion is configured to fold over the first portion, and the third portion is configured to fold over the first portion, and
wherein a surface opposite the mount includes a material adapted to selectively interconnect to the at least one interconnection location of the second surface of the light emitting device.

11. The light emitting device of claim 10, further comprising a diffusing material positioned over at least one of the first LED array and the second LED array.

12. The light emitting device of claim 10, further comprising a softbox interconnected to the first surface or the second surface, the softbox having a surface that extends from the first continuous surface.

13. The light emitting device of claim 12, wherein the softbox includes a series of orthogonally oriented strips positioned within the surface that extends from the first surface.

14. The light emitting device of claim 10, wherein the foldable border is a first foldable border, and further comprising a third LED array interconnected to the second LED array by a second foldable border, the first foldable border and the second foldable border defining a first fold line and a second fold line, wherein the third LED array is configured to rest on the first LED array or the second LED array when the light emitting device is in the second position of use.

15. The light emitting device of claim 10, wherein the foldable border is a first foldable border, and further comprising a third LED array and a fourth LED array connected to the first LED array and the second LED array to define a 2 by 2 grid, and wherein a second foldable boundary is provided that is orthogonal to the first foldable boundary.

16. The light emitting device of claim 1, wherein the first LED array and the second LED array are interconnected to rigid portions of the first continuous surface.

17. The light emitting device of claim 5, wherein the first LED array, the second LED array, and the third LED array are interconnected to rigid portions of the first continuous surface.

18. The light emitting device of claim 6, wherein the first LED array, the second LED array, the third LED array, and fourth LED array are interconnected to rigid portions of the first continuous surface.

19. The light emitting device of claim 14, wherein the first LED array and the second LED array are interconnected to rigid portions of the first continuous surface.

20. The light emitting device of claim 15, wherein the first LED array, the second LED array, the third LED array, and fourth LED array are interconnected to rigid portions of the first continuous surface.

* * * * *